(12) United States Patent
Yamazaki et al.

(10) Patent No.: US 7,306,982 B2
(45) Date of Patent: Dec. 11, 2007

(54) METHOD OF MANUFACTURING A SEMICONDUCTOR DEVICE

(75) Inventors: Shunpei Yamazaki, Setagaya (JP); Osamu Nakamura, Atsugi (JP); Masayuki Kajiwara, Atsugi (JP); Junichi Koezuka, Atsugi (JP); Koji Dairiki, Isehara (JP); Toru Mitsuki, Atsugi (JP); Toru Takayama, Atsugi (JP); Hideto Ohnuma, Atsugi (JP); Taketomi Asami, Kasukabe (JP); Mitsuhiro Ichijo, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/940,821

(22) Filed: Sep. 15, 2004

(65) Prior Publication Data

US 2005/0032336 A1    Feb. 10, 2005

Related U.S. Application Data

(62) Division of application No. 10/074,050, filed on Feb. 14, 2002, now Pat. No. 6,808,968.

(30) Foreign Application Priority Data

Feb. 16, 2001 (JP) .............................. 2001-040848

(51) Int. Cl.
  *H01L 21/84* (2006.01)
(52) U.S. Cl. ............... 438/166; 438/476; 257/E21.561
(58) Field of Classification Search ........ 438/151–166, 438/476; 257/E21.561
See application file for complete search history.

(56) References Cited

U.S. PATENT DOCUMENTS 3,535,775 A    10/1970  Garfinkel et al.

(Continued)

FOREIGN PATENT DOCUMENTS

EP    0 651 431    5/1995

(Continued)

OTHER PUBLICATIONS

U.S. Appl. No. 10/051,064, "Semiconductor Device and Method of Manufacturing the Same", Takashi Hamada et al., Jan. 18, 2002.

(Continued)

*Primary Examiner*—Richard A. Booth
(74) *Attorney, Agent, or Firm*—Eric J. Robinson; Robinson Intellectual Property Law Office, P.C.

(57) ABSTRACT

It is intended to achieve the reduction in number of heat treatments carried out at high temperature (at least 600° C.) and the employment of lower temperature processes (600° C. or lower), and to achieve step simplification and throughput improvement. In the present invention, a barrier layer (105), a second semiconductor film (106), and a third semiconductor layer (108) containing an impurity element (phosphorus) that imparts one conductive type are formed on a first semiconductor film (104) having a crystalline structure. Gettering is carried out in which the metal element contained in the first semiconductor film (104) is allowed to pass through the barrier layer (105) and the second semiconductor film (106) by a heat treatment to move into the third semiconductor film (107). Afterward, the second and third semiconductor films (106) and (107) are removed with the barrier layer (105) used as an etching stopper.

105 Claims, 15 Drawing Sheets

U.S. PATENT DOCUMENTS

| | | |
|---|---|---|
| 4,371,403 A | 2/1983 | Ikubo et al. |
| 4,477,308 A | 10/1984 | Gibson et al. |
| 4,534,820 A | 8/1985 | Mori et al. |
| 4,608,096 A | 8/1986 | Hill |
| 5,229,305 A | 7/1993 | Baker |
| 5,244,819 A | 9/1993 | Yue |
| 5,275,896 A | 1/1994 | Garofalo et al. |
| 5,313,076 A * | 5/1994 | Yamazaki et al. ............ 257/66 |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,714,395 A | 2/1998 | Bruel |
| 5,744,824 A | 4/1998 | Kousai et al. |
| 5,773,327 A | 6/1998 | Yamazaki et al. |
| 5,789,284 A * | 8/1998 | Yamazaki et al. .......... 438/166 |
| 5,814,540 A | 9/1998 | Takemura et al. |
| 5,843,225 A | 12/1998 | Takayama et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A * | 8/1999 | Miyanaga et al. ............ 257/66 |
| 5,949,115 A | 9/1999 | Yamazaki et al. |
| 5,956,579 A | 9/1999 | Yamazaki et al. |
| 5,960,252 A | 9/1999 | Matsuki et al. |
| 5,961,743 A * | 10/1999 | Yamazaki et al. .......... 136/258 |
| 5,977,559 A | 11/1999 | Zhang et al. |
| 5,985,740 A | 11/1999 | Yamazaki et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,066,547 A * | 5/2000 | Maekawa ................... 438/486 |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A | 7/2000 | Henley et al. |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,160,268 A | 12/2000 | Yamazaki |
| 6,162,704 A | 12/2000 | Yamazaki et al. |
| 6,165,824 A | 12/2000 | Takano et al. |
| 6,168,980 B1 | 1/2001 | Yamazaki et al. |
| 6,177,302 B1 * | 1/2001 | Yamazaki et al. .......... 438/158 |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,291,275 B1 | 9/2001 | Yamazaki et al. |
| 6,291,888 B1 | 9/2001 | Bhat et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,331,457 B1 | 12/2001 | Yamazaki et al. |
| 6,337,259 B1 | 1/2002 | Ueda et al. |
| 6,376,336 B1 | 4/2002 | Buynoski |
| 6,396,147 B1 | 5/2002 | Adachi et al. |
| 6,399,454 B1 | 6/2002 | Yamazaki |
| 6,436,745 B1 | 8/2002 | Gotou et al. |
| 6,451,672 B1 | 9/2002 | Caruso et al. |
| 6,489,189 B2 | 12/2002 | Yamazaki et al. |
| RE38,266 E | 10/2003 | Yamazaki et al. |
| 6,670,259 B1 | 12/2003 | Chan |
| 6,686,262 B2 | 2/2004 | Yamazaki et al. |
| 6,803,296 B2 | 10/2004 | Miyairi |
| 6,808,968 B2 | 10/2004 | Takayama et al. |
| 6,812,081 B2 | 11/2004 | Yamazaki et al. |
| 6,821,827 B2 | 11/2004 | Nakamura et al. |
| 6,821,828 B2 | 11/2004 | Ichijo et al. |
| 6,913,956 B2 | 7/2005 | Hamada et al. |
| 6,962,837 B2 | 11/2005 | Yamazaki |
| 6,991,976 B2 | 1/2006 | Yamazaki et al. |
| 7,045,444 B2 | 5/2006 | Yamazaki et al. |

| | | |
|---|---|---|
| 7,052,943 B2 | 5/2006 | Yamazaki et al. |
| 7,109,074 B2 | 9/2006 | Ichijo et al. |
| 7,115,453 B2 | 10/2006 | Nakamura et al. |
| 7,122,450 B2 | 10/2006 | Yamazaki et al. |
| 7,129,120 B2 | 10/2006 | Yamazaki |
| 7,141,822 B2 | 11/2006 | Nakamura et al. |
| 2001/0034088 A1 | 10/2001 | Nakamura et al. |
| 2002/0086469 A1 | 7/2002 | Kim et al. |
| 2002/0106861 A1 | 8/2002 | Yamazaki |
| 2002/0151120 A1 | 10/2002 | Yamazaki et al. |

FOREIGN PATENT DOCUMENTS

| | | |
|---|---|---|
| JP | 05-109737 | 4/1993 |
| JP | 07-130652 | 5/1995 |
| JP | 07-183540 | 7/1995 |
| JP | 08-078329 | 3/1996 |
| JP | 09-074207 | 3/1997 |
| JP | 09-115831 | 5/1997 |
| JP | 3032801 | 2/2000 |
| JP | 3032801 | 4/2000 |
| JP | 2000-260777 | 9/2000 |
| JP | 2001-210828 | 8/2001 |

OTHER PUBLICATIONS

U.S. Appl. No. 10/056,055, including specification, drawings and filing receipt, "Semiconductor Device and Manufacturing Method of the Same", Osamu Nakamura et al., Jan. 28, 2002.

U.S. Appl. No. 10/097,641, including specification, drawings and filing receipt, "Method of Manufacturing a Semiconductor Device", Shunpei Yamazaki et al., Mar. 15, 2002.

U.S. Appl. No. 10/072,931, including specification, drawings and filing receipt, "Method of Manufacturing a Semiconductor Device", Shunpei Yamazaki et al., filed Feb. 12, 2002.

U.S. Appl. No. 10/020,961, including specification, drawings and filing receipt, "Method of Manufacturing Semiconductor Device and Semiconductor Device", Shunpei Yamazaki et al., Dec. 19, 2001.

U.S. Appl. No. 10/066,542, including specification, drawings and filing receipt, "Semiconductor Device and Method for Manufacturing the Same", Osamu Nakamura et al., Feb. 5, 2002.

M. Miyake et al., "Characteristics of Buried-Channel pMOS Devices with Shallow Counter-Doped Layers Fabricated Using Channel Preamorphization", IEEE Transactions on Electron Devices, vol. 43, No. 3, Mar. 1996, pp. 444-449.

L. S. Lee et al., "Argon Ion-Implantation on Polysilicon or Amorphous-Silicon for Boron Penetration Suppression in p+ pMOSFET", IEEE Transactions on Electron Devices, vol. 45, No. 8, Aug. 1998, pp. 1737-1744.

D.J. Llewellyn et al., *Implantation and Annealing of Cu in InP for Electrical Isolation: Microstructural Characterisation*, IEEE, 1997, pp. 313-316.

Kevin S. Jones et al., *Boron Diffusion Upon Annealing of Laser Thermal Processed Silicon*, IEEE, 2000, pp. 111-114.

Specification, Claims, Abstract and Drawings of U.S. Appl. No. 08/907,182 filed Aug. 6, 1997, Inventor: Shunpei Yamazaki et al., Entitled *Thin-Film Photoelectric Conversion Device and a Method of Manufacturing the Same*, Official Filing Receipt, Amendment filed Sep. 13, 2003 (claim amendments).

* cited by examiner

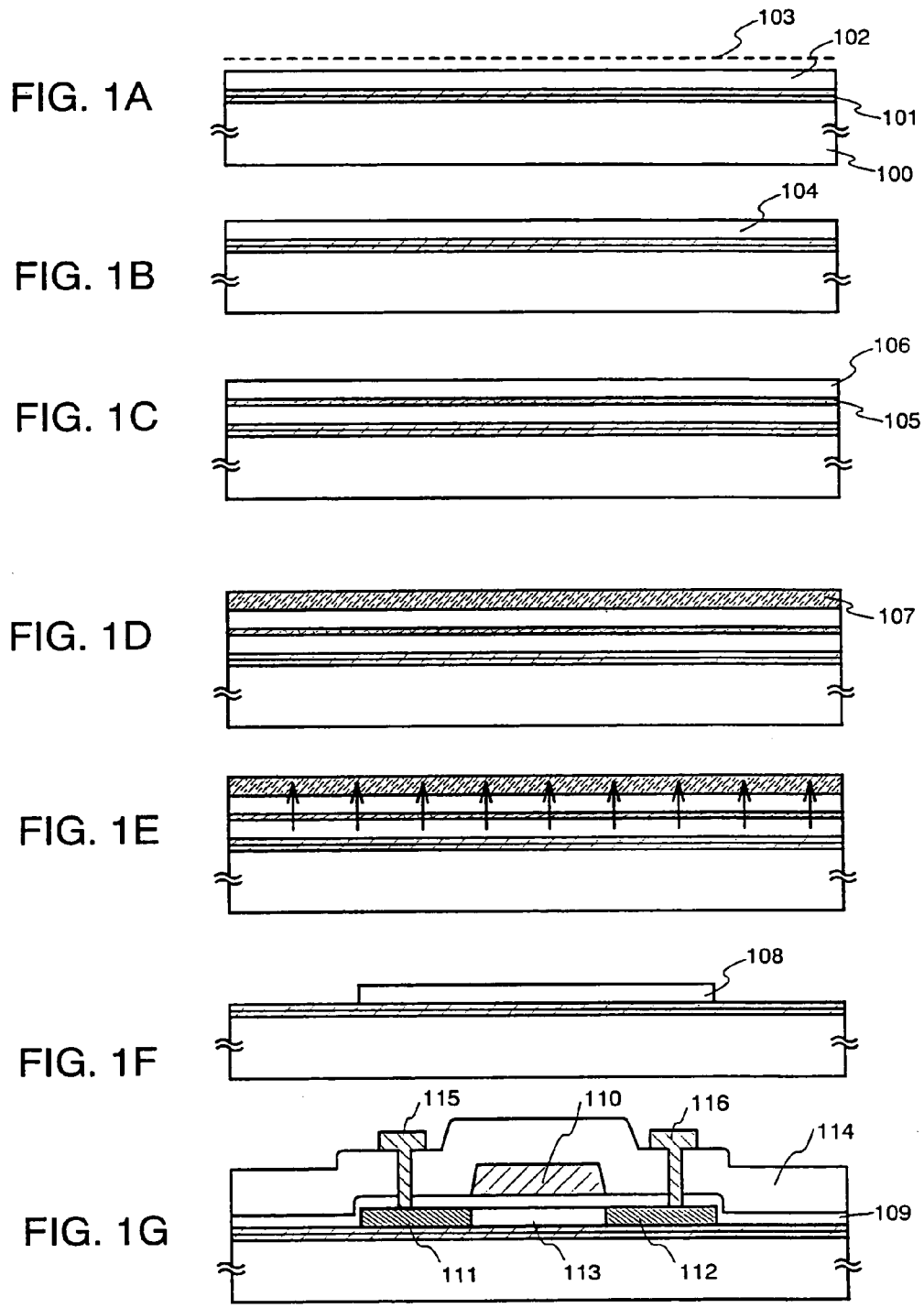

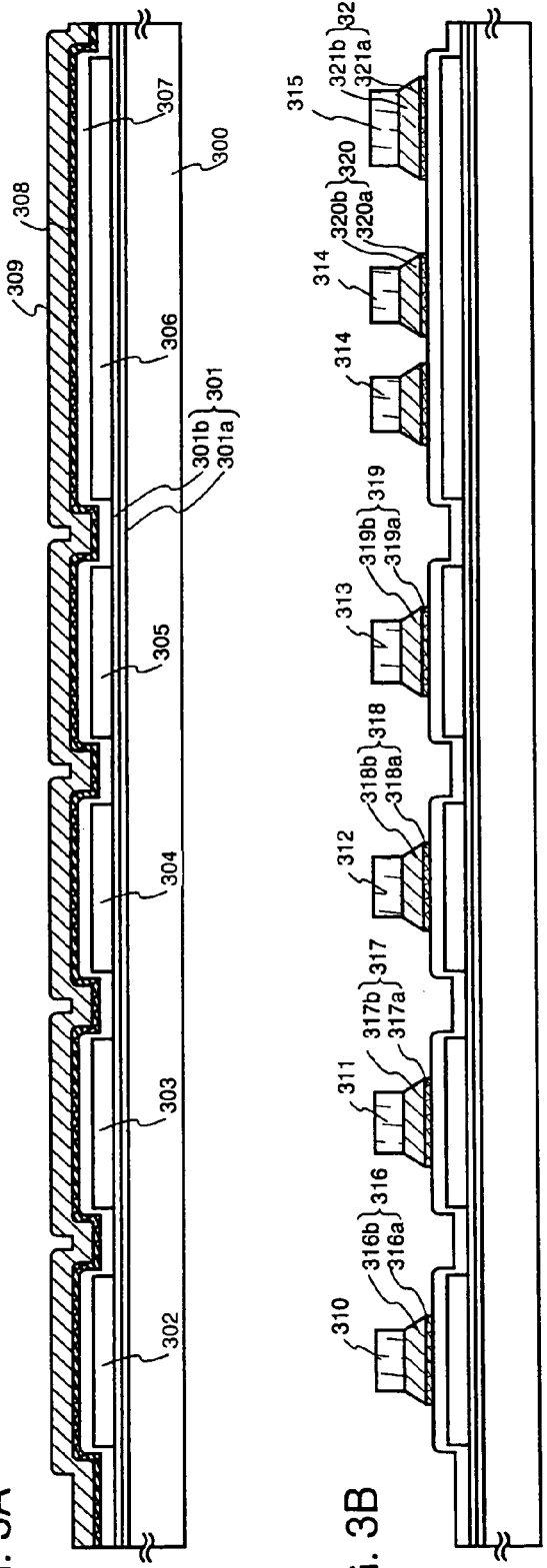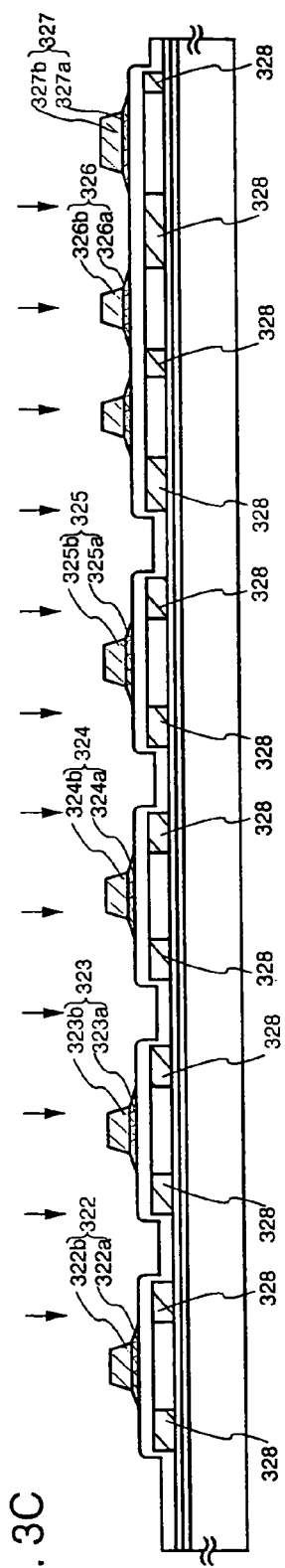

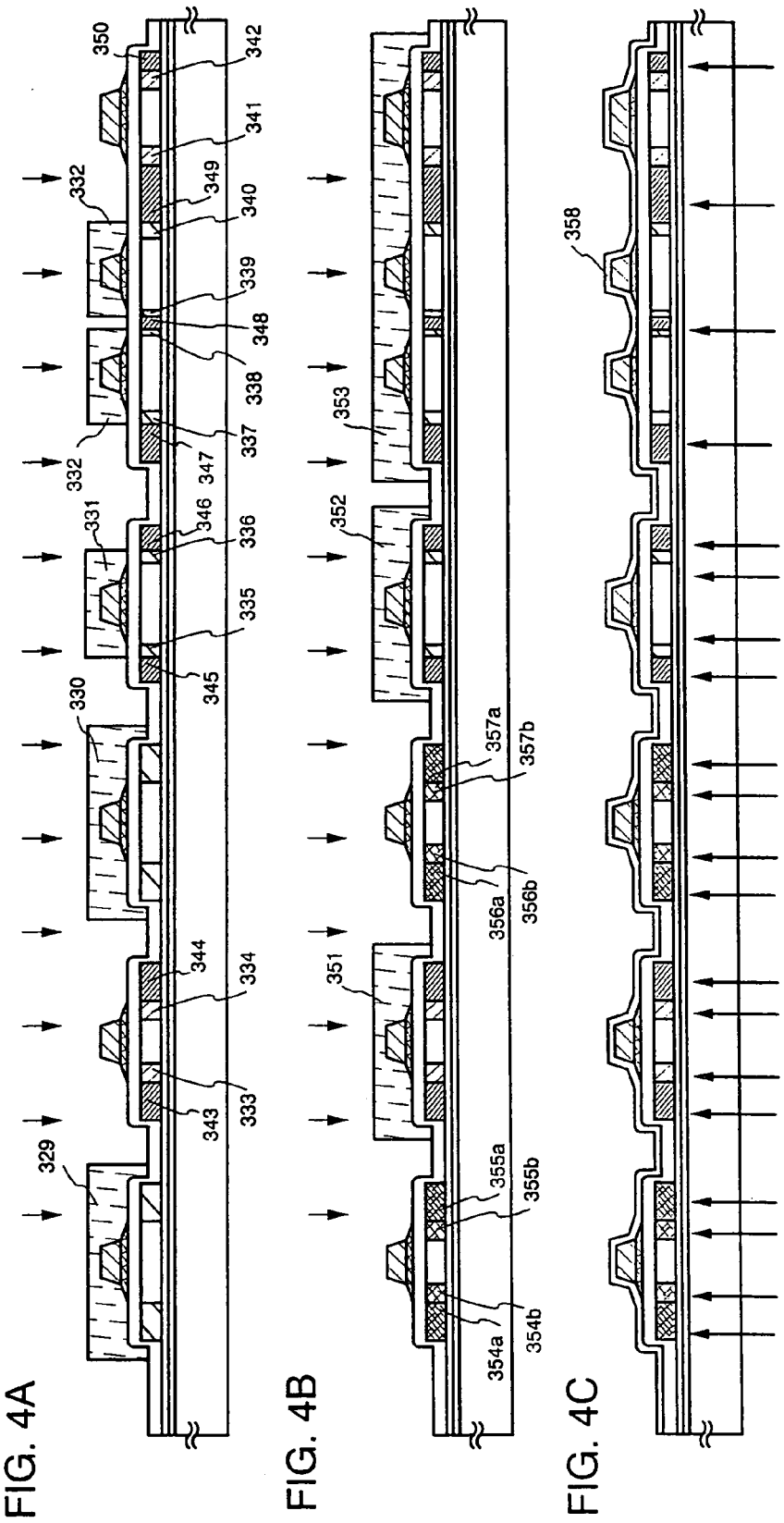

pixel TFT portion     capacitance portion

METHOD OF MANUFACTURING A SEMICONDUCTOR DEVICE

BACKGROUND OF THE INVENTION

1. Field of the Invention

The present invention relates to a method of manufacturing a semiconductor device using gettering technique. Particularly, the present invention relates to a method of manufacturing a semiconductor device using a crystalline semiconductor film fabricated through the addition of a metal element that catalyzes the crystallization of a semiconductor film.

In the present specification, the "semiconductor device" denotes devices in general that can function by utilizing semiconductor properties, and electro-optic devices, semiconductor circuits, and electronic equipment all are semiconductor devices.

2. Description of the Related Art

A thin film transistor (hereinafter referred to as a "TFT") has been known as a typical semiconductor device including a semiconductor film having a crystalline structure (hereinafter referred to as a "crystalline semiconductor film"). The TFT has been receiving attention as a technique of forming an integrated circuit on an insulating substrate such as glass, and for example, a driving circuit-integrated liquid crystal display device is proceeding toward practical utilization. In the conventional technique, an amorphous semiconductor film formed by a plasma CVD method or a low pressure CVD method is subjected to a heat treatment or a laser annealing process (a technique of crystallizing a semiconductor film by laser beam irradiation) and thereby a crystalline semiconductor film is fabricated.

The crystalline semiconductor film thus fabricated is an aggregation of many crystal grains crystal orientation of which is oriented in arbitral direction and the crystal orientation cannot be controlled, which constitutes a factor restricting the characteristics of the TFT. With respect to such a problem, Japanese Patent Application Laid-open No. Hei 7-183540 discloses a technique of fabricating a crystalline semiconductor film through the addition of a metal element such as nickel that catalyzes the crystallization of a semiconductor film. This technique not only provides an effect of lowering the heating temperature required for the crystallization but also can improve the orientation of crystal grains into a single direction. The formation of a TFT with such a crystalline semiconductor film allows not only electron field-effect mobility to be improved but also a sub-threshold coefficient (S-value) to be lowered and thus makes it possible to improve electric characteristics by leaps and bounds.

However, since the metal element that exerts a catalytic action is added, there are problems in that the metal element remains in the crystalline semiconductor film or at its surface to cause variations in characteristics of the device obtained, and the like. One example of the problems is a problem such that an Off-state current increases in the TFT and varies among individual devices. In other words, once the metal element that catalyzes crystallization is used to form a crystalline semiconductor film, it becomes rather an unwanted existence.

SUMMARY OF THE INVENTION

The present invention is intended to achieve the reduction in number of heat treatments carried out at high temperature (at least 600° C.) and the employment of lower temperature processes (600° C. or lower), and to achieve step simplification and throughput improvement.

A method of manufacturing a semiconductor device according to the present invention includes: a step of forming a first semiconductor film having a crystalline structure using a metal element; a step of forming a film (a barrier layer) to serve as an etching stopper; a step of forming a second semiconductor film; a step of forming a third semiconductor film (a gettering site) containing an impurity element that imparts one conductive type; a step of allowing the gettering site to getter the metal element; and a step of removing the second semiconductor film and the third semiconductor film.

The impurity element that imparts one conductive type to the semiconductor is one selected from the group consisting of elements belonging to Group 15 or 13 in the periodic table. Typical elements of elements belonging to Group 15 in the periodic table are phosphorus (P) and arsenic (As), and a typical element of elements belonging to Group 13 in the periodic table is boron (B).

The step of forming a third semiconductor film (a gettering site) containing an impurity element that imparts one conductive type may be carried out by the plasma CVD method or a low pressure thermal CVD method using a raw material gas containing an impurity element that imparts one conductive type. In this case, however, it is necessary to adjust film formation conditions so as to prevent the third semiconductor film from being peeled off. As another method, after a semiconductor film having an amorphous structure or a crystalline structure is formed, an impurity element that imparts one conductive type to the semiconductor film may be added to form the third semiconductor film. In addition, an ion doping process or an ion implantation process may be employed as the method for adding the impurity element that imparts one conductive type. As still another method, the third semiconductor film may be formed by sputtering technique using a target containing an impurity element that imparts one conductive type.

In addition to the impurity element that imparts one conductive type, one element or more selected from the group consisting of H, $H_2$, O, $O_2$, and rare gas elements may be added. The addition of a plurality of elements allows a gettering effect to be obtained synergistically. Of those, O and $O_2$ are effective, and gettering efficiency is improved when the oxygen concentration, which is determined by a secondary ion mass spectroscopy (SIMS) analysis, in the second or third semiconductor film is set to be at least $5 \times 10^{18}/cm^3$, preferably in the range of $1 \times 10^{19}/cm^3$ to $1 \times 10^{22}/cm^3$ as a film formation condition or by the addition of O or $O_2$ after film formation.

Since the impurity element that imparts one conductive type tends to diffuse, it is preferable to prevent the impurity element from diffusing into the first semiconductor film due to the heat treatment to be carried out later by controlling the thickness of the second semiconductor film. Besides the second semiconductor film, the barrier layer also has a function of preventing the diffusion. In this case, however, it is necessary to adjust the film formation conditions so as to prevent the second semiconductor film from being peeled off. For instance, when the second semiconductor film is formed by the plasma CVD method, it is preferable to form it by RF continuous oscillation under the conditions that allow tensile stress to be produced. When an amorphous silicon film is formed to have a thickness of 200 nm using silane gas ($SiH_4$ : with a flow rate of 100 sccm) as a film formation gas at an RF power of 35 W under a film formation pressure of 0.25 Torr, the tensile stress is about $1.12 \times 10^9$ (dynes/cm$^2$). As a comparative example, when an amorphous silicon film is formed by RF pulsed oscillation, the film may exert compressive stress (about $-9.7 \times 10^9$ (dynes/cm$^2$)) and thus may be peeled off.

Generally, the internal stress includes tensile stress and compressive stress. When a thin film formed on a substrate is going to shrink, the substrate pulls the thin film in the directions that prevent its shrinkage and thereby is deformed to make the thin film locate on the inner side. This is called "tensile stress". On the other hand, when the thin film is going to expand, the substrate is forced to be compressed and thereby is deformed to make the thin film locate on the outer side. This is called "compressive stress".

A first structure of the present invention disclosed in this specification relates to a method of manufacturing a semiconductor device, comprising: a first step of adding a metal element to a first semiconductor film having an amorphous structure; a second step of crystallizing the first semiconductor film to form a first semiconductor film having a crystalline structure; a third step of forming a barrier layer on a surface of the first semiconductor film having the crystalline structure; a fourth step of forming a second semiconductor film on the barrier layer; a fifth step of forming a third semiconductor film containing one conductive type impurity element on the second semiconductor film; a sixth of removing the metal element in the first semiconductor film having the crystalline structure or reducing its concentration by allowing the third semiconductor film to getter the metal element; and a seventh step of removing the second semiconductor film and the third semiconductor film.

In the above structure, the fifth step may include a step of forming a semiconductor film and a step of adding one conductive type impurity element to the semiconductor film, a step of forming the third semiconductor film containing one conductive type impurity element by a plasma CVD method or a low pressure thermal CVD method, or a step of forming the third semiconductor film containing one conductive type impurity element by sputtering technique.

Further, in the above structure, it is preferable that when the one conductive type impurity element is added, in addition to the one conductive type impurity element, at least one element selected from the group consisting of rare gas elements, O, O$_2$, H, and H$_2$ is added at the same step or in order.

In the above-mentioned configuration, the third semiconductor film is formed of a single layer of a semiconductor film having an amorphous or crystalline structure formed by the plasma CVD method, the low pressure thermal CVD method, or the sputtering technique or is formed of a laminated layer including a plurality of such semiconductor films.

The present invention is not limited to the above-mentioned configuration. While the third semiconductor film is not formed, one conductive type impurity element may be added only to an upper layer of the second semiconductor film to form a gettering site.

Further, a second structure of the present invention relates to a method of manufacturing a semiconductor device, comprising: a first step of adding a metal element to a first semiconductor film having an amorphous structure; a second step of crystallizing the first semiconductor film to form a first semiconductor film having a crystalline structure; a third step of forming a barrier layer on a surface of the first semiconductor film having the crystalline structure; a fourth step of forming a second semiconductor film on the barrier layer; a fifth step of adding one conductive type impurity element to an upper layer of the second semiconductor film; a sixth step of removing the metal element in the first semiconductor film having the crystalline structure or reducing its concentration by allowing the upper layer of the second semiconductor film to getter the metal element; and a seventh step of removing the second semiconductor film.

In the above structure, it is preferable that in addition to the one conductive type impurity element added in the fifth step, at least one element selected from the group consisting of rare gas elements, O, O$_2$, H, and H$_2$ is added at the same step or in order.

In the above-mentioned two configurations, the second semiconductor film is formed of a single layer of a semiconductor film that has an amorphous or crystalline structure formed by the plasma CVD method, the low pressure thermal CVD method, or the sputtering technique or is formed of a laminated layer including a plurality of such semiconductor films. In addition, it is desirable that the second semiconductor film have tensile stress.

In the above structures, the metal element is at least one element selected from the group consisting of Fe, Ni, Co, Ru, Rh, Pd, Os, Ir, Pt, Cu, and Au.

In the above-mentioned respective configurations, the second step is carried out by one process selected from the group consisting of a heat treatment, strong light irradiation, and laser beam irradiation (using an excimer laser beam with a wavelength of 400 nm or shorter, or second harmonic or third harmonic of a YAG laser) or a combination thereof.

In the above-mentioned respective configurations, the third step of forming the barrier layer may be carried out by oxidizing the surface of the semiconductor film having the crystalline structure with a solution containing ozone or oxidizing the surface of the semiconductor film having the crystalline structure by ultraviolet irradiation in an oxygen atmosphere.

Furthermore, in the above-mentioned respective configurations, the sixth step is carried out by a heat treatment or a process of irradiating the semiconductor film having the amorphous structure with strong light or by a heat treatment and a process of irradiating the semiconductor film having the amorphous structure with strong light.

Further, in the above structures, when applying the strong light, light may e used which is emitted from one selected from the group consisting of a halogen amp, a metal halide lamp, a xenon arc lamp, a carbon arc lamp, a high pressure odium lamp, and a high pressure mercury lamp.

Further, in the above structures, the rare gas element is at least one selected from the group consisting of He, Ne, Ar, Kr, and Xe.

Further, in the above structures, the one conductive type impurity element is at least one selected from the group consisting of elements belonging to Group 15 or 13 in the periodic table.

BRIEF DESCRIPTION OF THE DRAWINGS

In the accompanying drawings:

FIGS. 1A to 1G are drawings showing steps of manufacturing a TFT;

FIGS. 3A to 3C are drawings showing steps of manufacturing an active matrix substrate;

FIGS. 4A to 4C are drawings showing steps of manufacturing the active matrix substrate;

DETAILED DESCRIPTION OF THE PREFERRED EMBODIMENTS

Figure 2A:
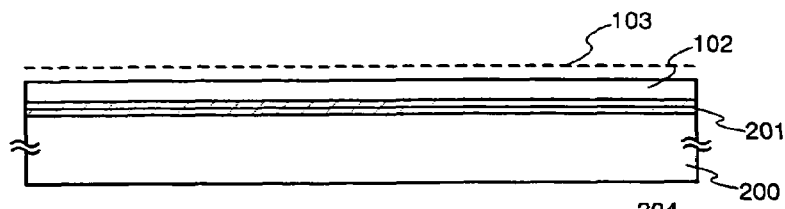
FIGS. 2A to 2G are drawings showing steps of manufacturing a TFT.

Embodiment modes of the present invention will be described as follows.

One aspect of the present invention is characterized by including: a process of forming a barrier layer and a semiconductor film on a crystalline semiconductor film; a process of forming a semiconductor film (a gettering site) containing one conductive type impurity element above the crystalline semiconductor film; and a process of carrying out a heat treatment, wherein metal contained in the crystalline semiconductor film moves due to the heat treatment, goes through the barrier layer and the semiconductor film (the semiconductor film that does not contain the one conductive type impurity element ions), and is trapped by the gettering site (the semiconductor film containing the one conductive type impurity element ions) and thereby the metal element is removed from the crystalline semiconductor film or its concentration is reduced. Strong light irradiation may be carried out instead of or in addition to the heat treatment.

Embodiment Mode 1

A typical manufacturing procedure is described briefly with reference to FIGS. 1A to 1G as follows.

In FIG. 1A, reference numeral 100 denotes a substrate with an insulating surface; 101, a base insulating film; and 102, a semiconductor film having an amorphous structure.

First, on the substrate 100 is formed the base insulating film 101 formed of an insulating film such as a silicon oxide film, a silicon nitride film, or a silicon oxynitride film as a blocking layer. Here, for the base insulating film 101, a two-layer structure (including a silicon oxynitride film with a thickness of 50 nm and a silicon oxynitride film with a thickness of 100 nm) is employed, but a single-layer structure or a structure including two laminated layers or more may be employed. When it is not necessary to provide the blocking layer, however, the formation of the base insulating film may be omitted.

Next, the semiconductor film 102 having the amorphous structure is crystallized by a well-known method and thereby a semiconductor film 104 having a crystalline structure is formed on the base insulating film (FIG. 1B).

In the present invention, the semiconductor film having the crystalline structure may be obtained as follows: a metal element is added to the semiconductor film 102 having the amorphous structure obtained by the plasma CVD method, the low pressure thermal CVD method, or the sputtering technique and then the semiconductor film 102 is subjected to the heat treatment or strong light irradiation to be crystallized. Here, an amorphous silicon film is formed and a nickel-containing solution is applied thereonto. Thus, a nickel-containing film 103 is formed.

After the crystallization, the segregated metal element may be removed or its concentration may be reduced with an etchant containing hydrofluoric acid, for example, dilute hydrofluoric acid or FPM (a mixed solution of hydrofluoric acid, a hydrogen peroxide solution, and pure water). When the surface has been subjected to etching with an etchant containing hydrofluoric acid, it is desirable that the surface be flattened by strong light irradiation.

After the crystallization described above, irradiation with a laser beam or strong light may be carried out further to improve the crystallization. After this irradiation with a laser beam or strong light to promote the crystallization, the segregated metal element may be removed or its concentration may be reduced with the etchant containing hydrofluoric acid and in addition, strong light irradiation may be carried out to flatten the surface.

It is desirable that the semiconductor film 104 having the crystalline structure be formed to have an oxygen concentration (determined by the SIMS analysis) of $5 \times 10^{18}/cm^3$ or lower.

Next, a barrier layer 105 containing silicon as a main component is formed on the semiconductor film 104 having the crystalline structure. This barrier layer 105 may be very thin. It may be a natural oxide film or an oxide film obtained through the oxidation with ozone produced by ultraviolet irradiation in an atmosphere containing oxygen. Furthermore, this barrier layer 105 may be an oxide film obtained through the oxidation with a solution containing ozone used for a surface treatment called "hydro-washing" that is carried out for the removal of carbon, i.e. organic substances. This barrier layer 105 mainly is used as an etching stopper. After the formation of this barrier layer 105, channel doping is carried out and then strong light irradiation may be carried out for activation.

Next, a second intrinsic semiconductor film 106 is formed on the barrier layer 105. The second semiconductor film 106 may be formed by plasma CVD method using a mixture of hydrogen with silane, disilane, or trisilane. This second semiconductor film 106 may be a semiconductor film having an amorphous structure or a semiconductor film having a crystalline structure. The thickness of this second semiconductor film 106 is set to be 5 to 50 nm, preferably 10 to 20 nm. It is desirable that the second semiconductor film 106 be allowed to contain oxygen (whose concentration determined by the SIMS analysis is at least $5 \times 10^{18}/cm^3$, preferably at least $1 \times 10^{19}/cm^3$) and thereby the gettering efficiency be improved.

Next, a third semiconductor film (a gettering site) 107 containing one conductive type impurity element, which is phosphorus in this embodiment mode, is formed on the second semiconductor film 106. This third semiconductor film 107 may be a semiconductor film having an amorphous structure formed by the plasma CVD method, the low pressure thermal CVD method, or the sputtering technique or may be a semiconductor film having a crystalline structure. Furthermore, the third semiconductor film may be a semiconductor film that is allowed to contain phosphorus when formed, or may be obtained through the formation of a semiconductor film free from phosphorus and then addition of phosphorus thereto. The second semiconductor film and the third semiconductor film may be formed successively without being exposed to the air. In addition, the sum of the thickness of the second semiconductor film and that of the third semiconductor film may be set to be 30 to 200 nm, for example, 50 nm.

In the present invention, the second semiconductor film 106 is used for providing a spacing between the first semiconductor film 104 and the third semiconductor film (the gettering site) 107. In gettering, the metal element tends to gather in the vicinity of the boundary of the gettering site. Hence, it is desirable to improve the gettering efficiency by keeping the boundary of the gettering site away from the first semiconductor film 104 using the second semiconductor film 106 as in the present invention. Additionally, the second semiconductor film 106 also has a blocking effect for preventing phosphorus contained in the gettering site from diffusing and reaching the interface with the first semiconductor film 104 during gettering. Moreover, the second semiconductor film 106 also has a protection effect for preventing the first semiconductor film 104 from being 15 damaged when phosphorus is added.

Next, gettering is carried out. A gettering step may be carried out by a heat treatment in a nitrogen atmosphere at 450 to 800° C. for 1 to 24 hours, for example, at 550° C. for 14 hours. Instead of the heat treatment using a furnace (including furnace annealing), irradiation with strong light emitted from a lamp light source may be carried out. The irradiation with strong light may be carried out in addition to the heat treatment. This gettering allows nickel to move in the direction indicated by the arrows shown in FIG. 1E and thereby the metal element contained in the semiconductor film 104 covered with the barrier layer 105 is removed or its concentration is reduced. In this case, the heat treatment also serves as annealing. Here, all nickel is allowed to move into the third semiconductor film 107 so as not to segregate in the first semiconductor film 104. Thus, nickel is hardly present in the first semiconductor film 104. In other words, gettering is carried out to a sufficient degree so that the nickel concentration in the film is reduced to $1 \times 10^{18}/cm^3$ or lower, preferably $1 \times 10^{17}/cm^3$ or lower.

Next, only the semiconductor films indicated with the reference numerals 106 and 107 are removed selectively with the barrier layer 105 used as an etching stopper. Afterward, the semiconductor film 104 is patterned by a well-known patterning technique and thereby a semiconductor layer 108 with a desired shape is formed.

Next, the surface of the semiconductor layer 108 is washed with an etchant containing hydrofluoric acid and then an insulating film containing silicon as a main component to be a gate insulating film 109 is formed. It is desirable to carry out the surface washing and the formation of the gate insulating film successively while the exposure to the air is avoided.

Next, after the surface of the gate insulating film is washed, a gate electrode 110 is formed. Subsequently, an impurity element (P, As, or the like) that imparts n-type conductivity to the semiconductor, for example, phosphorus in this case is added suitably and thereby a source region 111 and a drain region 112 are formed. After the addition of the impurity element, a heat treatment, strong light irradiation, or laser beam irradiation is carried out to activate the impurity element. While the impurity element is activated, the plasma damage to the gate insulating film and that to the interface between the gate insulating film and the semiconductor film can be recovered. Particularly, it is very effective to activate the impurity element through irradiation with second harmonic of a YAG laser from the surface or rear face side in an atmosphere at a room temperature to 300° C. The YAG laser requires less maintenance and thus is a preferable activation means.

In the subsequent steps, an interlayer insulating film 114 is formed, hydrogenation is carried out to form contact holes reaching the source and drain regions, and then a source electrode 115 and a drain electrode 116 are formed. Thus, a TFT is completed.

In the TFT thus obtained, at least the nickel element contained in the channel formation region 113 has been removed, and the one conductive type impurity element (phosphorus) also is not contained in the channel formation region 113.

The present invention is not limited to the configuration shown in FIGS. 1A to 1G. The present invention may employ a lightly doped drain (LDD) structure having an LDD region between the channel formation region and the drain region (or the source region) if necessary. This configuration includes a region to which an impurity element is added to be contained at a low concentration and which is provided between the channel formation region and the source or drain region formed through the addition of an impurity element to be contained at a high concentration. This region is called an "LDD region". Furthermore, a so-called GOLD (gate-drain overlapped LDD) structure may be employed in which the LDD region is placed to overlap with the gate electrode with the gate insulating film interposed therebetween.

One conductive type impurity element may be added only to the upper layer of the second semiconductor film to form a gettering site while the third semiconductor film shown in FIG. 1D is not formed.

In this embodiment mode, the description was made with respect to an n-channel type TFT. However, it is to be understood that a p-channel type TFT can be formed by using an impurity element that imparts p-type conductivity to the semiconductor instead of the impurity element that imparts the n-type conductivity to the semiconductor.

Furthermore, in this embodiment mode, the description was directed to the top gate type TFT as an example. However, the present invention can be applied irrespective of the TFT structure. For instance, the present invention can be applied to a bottom gate type (a reverse stagger type) TFT or a forward stagger type Embodiment Mode 2

After the formation of the third semiconductor film described in the embodiment mode 1, additionally, one conductive type impurity element may be added to form a gettering site. One example of such a configuration is described in this embodiment mode with reference to FIGS. 2A to 2G.

Figure 2B:
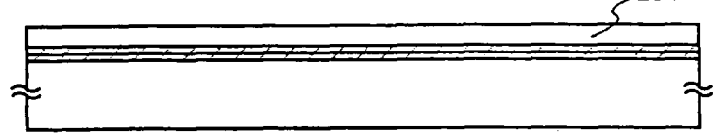

The same steps as in the embodiment mode 1 are carried out until a third semiconductor film 207 is formed. According to the embodiment mode 1, a base insulating film 201 and a semiconductor film 204 having a crystalline structure are formed on a substrate 200 and then a barrier layer 205 is formed thereon. Similarly to the embodiment mode 1, in this embodiment mode, nickel is used for the crystallization. FIGS. 2A and 2B correspond to FIGS. 1A and 1B, respectively.

Figure 2C:
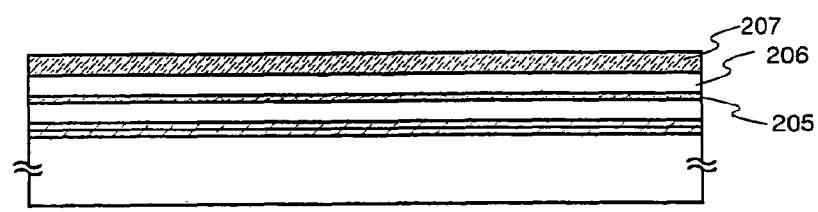

Next, on the barrier layer 205 are formed a second semiconductor film 206 and a third semiconductor film 207 containing phosphorus as an impurity element that imparts one conductive type as in the embodiment mode 1. FIG. 2C corresponds to FIG. 1D.

Figure 2D:
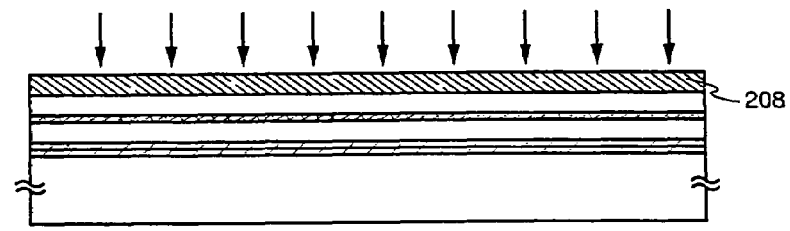
Figure 2E:
Figure 2F:
Figure 2G:
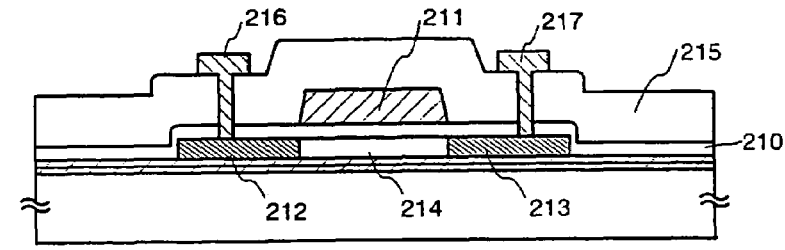

Next, one conductive type impurity element is added to the third semiconductor film 207. As shown in FIG. 2D, the region to which the one conductive type impurity element is added is indicated with reference numeral 208. This region 208 serves as a gettering site. In addition to the one conductive type impurity element, one element or more selected from the group consisting of rare gas elements, O, $O_2$, H, and $H_2$ may be added in the same step or sequentially. A rare gas element may be added instead of the one conductive type impurity element. An impurity element with one conductive type (p-type) that is different from the conductive type (n-type) of the impurity element contained in the third semiconductor film may be added.

Next, gettering is carried out. The gettering step may be carried out by a heat treatment in a nitrogen atmosphere at 450 to 800° C. for 1 to 24 hours, for example, at 550° C. for 14 hours. Instead of the heat treatment, strong light irradiation may be carried out. The strong light irradiation may be carried out in addition to the heat treatment. This gettering allows nickel to move in the direction indicated by the arrows shown in FIG. 2E and thereby the metal element contained in the semiconductor film 204 covered with the barrier layer 205 is removed or its concentration is reduced. Here, gettering is carried out to a sufficient degree so that all nickel is allowed to move into the third semiconductor film 208 so as not to segregate in the first semiconductor film 204 and thus nickel is hardly present in the first semiconductor film 204.

Next, only the semiconductor films indicated with the reference numerals 206 and 208 are removed selectively with the barrier layer 205 used as an etching stopper. Afterward, the semiconductor film 204 is patterned by a well-known patterning technique and thereby a semiconductor film 209 with a desired shape is formed.

In the subsequent steps according to the embodiment mode 1, a gate insulating film 210 and a gate electrode 211 are formed, a source region 212 and a drain region 213 are formed through the addition of an impurity element that imparts n-type conductivity to the semiconductor, an interlayer insulating film 215 is then formed, hydrogenation is carried out to form contact holes reaching the source and drain regions, and then a source electrode 216 and a drain electrode 217 are formed. Thus, a TFT is completed.

Also in the TFT thus obtained, at least the nickel element contained in a channel formation region 214 has been removed and the channel formation region 214 does not contain the element that imparts one conductive type.

The present invention that employs the above-mentioned configurations is described further in detail by means of embodiments below.

EMBODIMENTS

Embodiment 1

In this embodiment, a method of simultaneously fabricating a pixel portion and TFTs (n-channel type TFTs and p-channel type TFTs) of a driver circuit provided around the pixel portion on one substrate is described with reference to FIGS. 3A to 5.

First, in this embodiment, a substrate 300 was used that was made of glass such as aluminoborosilicate glass or barium borosilicate glass represented by glass #1737 or #7059 manufactured by Corning Incorporated. The substrate 300 is not limited as long as it has light transmittance. A quartz substrate may be used as the substrate 300. Alternatively, a plastic substrate may be used that has heat resistance to the treatment temperature in the present embodiment.

Next, a base film 301 formed of an insulating film such as a silicon oxide film, a silicon nitride film, a silicon oxynitride film, or the like is formed on the substrate. 300. In the present embodiment, a two-layer structure was employed for the base film 301. However, a single-layer structure of the above-mentioned insulating film or a structure including two laminated layers or more may be employed. As the first layer of the base film 301, a silicon oxynitride film 301a is formed to have a thickness of 10 to 200 nm (preferably, 50 to 100 nm) by the plasma CVD method using $SiH_4$, $NH_3$, and $N_2O$ as reactant gas. In this example, a silicon oxynitride film 301a (with a composition ratio (%) of Si:O:N:H=32:27:24:17) with a thickness of 50 nm was formed. Subsequently, as the second layer of the base film 301, a silicon oxynitride film 301b is formed to have a thickness of 50 to 200 nm (preferably, 100 to 150 nm) by the plasma CVD method using $SiH_4$ and $N_2O$ as reactant gas to be laminated on the silicon oxynitride film 301a. In this embodiment, a silicon oxynitride film 301b (with a composition ratio (%) of Si:O:N:H=32:59:7:2) with a thickness of 100 nm was formed.

Next, semiconductor films 302 to 306 are formed on the base film. The semiconductor films 302 to 306 are formed as follows: after a semiconductor film having an amorphous structure is formed by a well-known method (such as the sputtering technique, the LPCVD method, or the plasma CVD method), a well-known crystallization process (a laser crystallization method, a thermal crystallization method, a thermal crystallization method using a catalyst such as nickel, or the like) is carried out, and then the crystalline semiconductor film thus obtained is patterned to have a desired shape. These semiconductor films 302 to 306 each are formed to have a thickness of 25 to 80 nm (preferably 30 to 60 nm). The material for the crystalline semiconductor films is not limited. Preferably, however, they may be made of silicon or a silicon-germanium ($Si_xGe_{1-x}$ (X=0.0001 to 0.02)) alloy, for example, they may be formed of a silicon germanium film in which a content ratio of germanium to silicon is 0.02 to 2 atom%.

In the present embodiment, an amorphous silicon film with a thickness of 55 nm was formed by the plasma CVD method and then a nickel-containing solution was allowed to be retained on the amorphous silicon film. This amorphous silicon film was subjected to dehydrogenation (at 500° C. for one hour) and then to thermal crystallization (at 550° C. for four hours). Afterward, in order further to improve the crystallization, a laser annealing step was carried out to form a crystalline silicon film. Subsequently, according to the embodiment mode 1, an ultrathin oxide film was formed on its surface with a solution containing ozone. Afterward, on the oxide film was formed a second semiconductor film containing oxygen (whose concentration determined by the SIMS analysis was at least $5\times10^{18}/cm^3$, preferably at least $1\times10^{19}/cm^3$) and a third semiconductor film containing a phosphorus element (whose concentration determined by the SIMS analysis was at least $1\times10^{19}/cm^3$, preferably at least $5\times10^{19}/cm^3$). Next, according to the embodiment mode 1, after gettering was carried out by a heat treatment, the second and third semiconductor films were removed with the oxide film used as an etching stopper, the crystalline silicon film was patterned, and then the oxide film was removed. Thus, the semiconductor films 302 to 306 formed of a crystalline silicon film with a nickel concentration of $1\times10^{18}/cm^3$ or lower, preferably $1\times10^{17}/cm^3$ or lower were formed. The state of the semiconductor films 302 to 306 after the completion of the patterning corresponds to the state shown in FIG. 1F in the embodiment mode 1. After the formation of the oxide film, doping (also called "channel doping") may be carried out suitably using a trace amount of impurity element (boron or phosphorus) to control the threshold value of the TFT.

Next, the surfaces of the semiconductor films 302 to 306 are washed with a hydrofluoric acid-based etchant such as buffer hydrofluoric acid or the like. Afterward, an insulating film 307 containing silicon as a main component is formed to have a thickness of 40 to 150 nm by the plasma CVD method or sputtering technique. In this embodiment, a silicon oxynitride film (with a composition ratio (%) of Si:O:N:H=32:59:7:2) was formed to have a thickness of 115 nm by the plasma CVD method. Of course, this insulating film to be a gate insulating film is not limited to the silicon oxynitride film and may be another insulating film containing silicon having a single-layer structure or a laminated layer structure.

Next, as shown in FIG. 3A, on the gate insulating film 307 are formed a first conductive film 308 with a thickness of 20 to 100 nm and a second conductive film 309 with a thickness of 100 to 400 nm to be laminated. In this embodiment, the first conductive film 308 formed of a TaN film with a thickness of 30 nm and the second conductive film 309 formed of a W film with a thickness of 370 nm were formed to be laminated. The TaN film was formed by the sputtering technique. The sputtering was carried out in an atmosphere containing nitrogen using a Ta target. The W film was formed by the sputtering technique using a W target. The W film also can be formed by the thermal CVD method using tungsten hexafluoride ($WF_6$).

In this embodiment, the first and second conductive films 308 and 309 were made of TaN and W, respectively. However, they are not particularly limited and each of them may be formed to have a single-layer structure or a laminated layer structure using an element selected from the group consisting of Ta, W, Ti, Mo, Al, Cu, Cr, and Nd, or an alloy or compound material containing one of the above-mentioned elements as a main component. In addition, a semiconductor film may be used that is represented by a polycrystalline silicon film doped with an impurity element such as phosphorus or the like. Furthermore, an Ag—Pd—Cu alloy may be used. Moreover, combinations may be employed including a combination of a first conductive film formed of a tantalum (Ta) film and a second conductive film formed of a W film, a combination of a first conductive film formed of a titanium nitride (TiN) film and a second conductive film formed of a W film, a combination of a first conductive film formed of a tantalum nitride (TaN) film and a second conductive film formed of an Al film, and a combination of a first conductive film formed of a tantalum nitride (TaN) film and a second conductive film formed of a Cu film.

Next, masks 310 to 315 made of a resist are formed by photolithography and a first etching process is carried out to form electrodes and wirings. The first etching process is carried out under first and second etching conditions. In this embodiment, the following conditions as first etching conditions were employed. That is, an inductively coupled plasma (ICP) etching method was used, $CF_4$, $Cl_2$, and $O_2$ were used as etching gas, the flow ratio among the respective gases was set to 25/25/10 (sccm), and an RF (13.56 MHz) power of 500 W was applied to coil type electrodes under a pressure of 1 Pa to produce plasma for etching. In addition, chlorine-based gas represented by $Cl_2$, $BCl_3$, $SiCl_4$, $CCl_4$, and the like, fluorine-based gas represented by $CF_4$, $SF_6$, $NF_3$, and the like, or $O_2$ may be used suitably for the etching gas. In this embodiment, a dry etching apparatus (Model No. E645-□ICP) utilizing ICP manufactured by Matsushita Electric Industrial Co., Ltd was used. An RF (13.56 MHz) power of 150 W also is applied to the substrate side (a sample stage) and thereby substantially negative self-bias voltage is applied thereto. The W film is etched under the first etching conditions and thereby the end portions of respective first conductive films are formed into a tapered shape. Under the first etching conditions, the etching rates with respect to W and TaN are 200.39 nm/min and 80.32 nm/min, respectively, and the selection ratio of W to TaN is about 2.5. In addition, the first etching conditions provide the W film with a taper angle of about 26°.

Subsequently, while the first etching conditions were replaced by the second etching conditions and the masks 310 to 315 made of a resist were not removed, etching was carried out for about 30 seconds under the following conditions as second etching conditions. That is, $CF_4$ and $Cl_2$, were used as etching gas, a ratio of flow rate between the respective gases was set to 30/30 (sccm), and an RF (13.56 MHz) power of 500 W was applied to coil type electrodes under a pressure of 1 Pa to produce plasma. An RF (13.56 MHz) power of 20 W also is applied to the substrate side (a sample stage) and thereby substantially negative self-bias voltage is applied thereto. Under the second etching conditions in which a mixture of $CF_4$ and $Cl_2$ is used, both the W and TaN films are etched to the same degree. Under the second etching conditions, the etching rates with respect to W and TaN are 58.97 nm/min and 66.43 nm/min, respectively. The etching time may be lengthened by about 10 to 20% to allow the etching to be completed with no residue remaining on the gate insulating film.

In the above-mentioned first etching process, the masks made of a resist are formed into a suitable shape, which allows the end portions of the first and second conductive films to have a tapered shape due to the effect of bias voltage applied to the substrate side. The taper angle of these tapered portions may be set to be 15 to 45°.

Thus, conductive layers 316 to 321 (including first conductive layers 316a to 321a and second conductive layers 316b to 321b) with a first shape formed of the first and second conductive films are formed by the first etching process. In the insulating film 307 to be a gate insulating film, regions that are not covered with the conductive layers 316 to 321 having the first shape have been etched by about 10 to 20 nm to be thin regions although they are not shown in the figures.

In the present embodiment, a second etching process is carried out subsequent to the first etching process while the masks made of a resist are not removed. Here, $SF_6$, $Cl_2$, and $O_2$ were used as etching gas, a ratio of flow rate among the respective gases was set to 24/12/24 (sccm), and an RF (13.56 MHz) power of 700 W was applied to coil type electrodes under a pressure of 1.3 Pa to produce plasma. Thus, etching was carried out for 25 seconds. In addition, an RF (13.56 MHz) power of 10 W also is applied to the substrate side (a sample stage) and thereby substantially negative self-bias voltage is applied thereto. In the second etching process, the etching rates with respect to W and TaN are 227.3 nm/min and 32.1 nm/min, respectively, and the selection ratio of W to TaN is about 7.1. In addition, the etching rate with respect to SiON forming the insulating film 307 is 33.7 nm/min, and the selection ratio of W to TaN is 6.83. Hence, when $SF_6$ is used for the etching gas, the reduction in film thickness can be suppressed due to the high selection ratio with respect to the insulating film 307. In TFTs of a driver circuit, reliability increases with increase in width in the channel-length direction of the tapered portions. Hence, it is effective to carry out dry etching using an etching gas containing $SF_6$ when the tapered portions are formed.

This second etching process allowed the taper angle of the W film to be 70°. Second conductive layers 322b to 327b are formed by this second etching process. While the first conductive films are hardly etched the first conductive layers 322a to 327a are formed. Thus, conductive layers 322 to 327 are formed. In the above-mentioned second etching process, it also is possible to use $CF_4$, $Cl_2$, and $O_2$ for the etching gas.

Next, after the masks made of a resist are removed, a first doping process is carried out to obtain the state shown in FIG. 3C. The doping is carried out while an impurity element is prevented from being added to the semiconductor films located below the tapered portions of the first conductive films using the first conductive layers 322a to 327a as a mask with respect to the impurity element. In this embodiment, plasma doping was carried out using P (phosphorus) as the impurity element and phosphine ($PH_3$) 5% hydrogen dilution gas at a gas flow rate of 30 sccm. Thus, low-concentration impurity regions (n⁻ regions) 328 overlapping with the first conductive films are formed in a self-aligning manner. The concentration of phosphorus (P) added to the low-concentration impurity regions 328 is $1\times10^{17}$ to $1\times10^{19}/cm^3$.

In the first doping process, doping may be carried out so that the impurity element is added to the semiconductor films located below the tapered portions of the first conductive films. In this case, the semiconductor layers located below the tapered portions have a concentration gradient in accordance with the film thickness of the tapered portions of the first conductive layers.

Next, masks 329 and 330 made of a resist are formed and then a second doping process is carried out to add an impurity element that imparts n-type conductivity to the semiconductor layers (FIG. 4A). The semiconductor films to be active layers of p-channel type TFTs later are covered with the masks 329 and 330. The doping process may be carried out by ion doping or ion implantation. Here, phosphorus was used as an impurity element that imparts n-type conductivity and was added by ion doping using phosphine ($PH_3$) 5% hydrogen dilution gas.

By the second doping process, in the semiconductor layer 303 to be an n-channel type TFT of a logic circuit portion later are formed high-concentration impurity regions (n⁺ regions) 343 and 344 in a self-aligning manner with the conductive layer 323 serving as a mask with respect to phosphorus. Additionally, in this second doping process, phosphorus also is added to the portions located below the tapered portions and thereby low-concentration impurity regions (n-regions) 333 and 334 are formed. Thus, the n-channel type TFT of the logic circuit portion to be formed later is provided only with the regions overlapping with the gate electrode (GOLD regions). In the low-concentration impurity regions (n⁻ regions) 333 and 334, the impurity concentration (P concentration) gradually decreases in the semiconductor layer overlapping with the tapered portions of the first conductive layer inwardly from the end portions of the tapered portions of the first conductive layer.

In addition, by the second doping process, in the semiconductor film 305 to be an n-channel type TFT of a sampling circuit portion later are formed high-concentration impurity regions 345 and 346 in the regions that have not been covered with a mask 331 and low-concentration impurity regions (n⁻ regions) 335 and 336 in the regions covered with the mask 331. Hence, the n-channel type TFT of the sampling circuit portion is provided only with the low-concentration impurity regions (LDD regions) that do not overlap with the gate electrode.

Furthermore, by the second doping process, in the semiconductor layer 306 to be an n-channel type TFT of a pixel portion later are formed high-concentration impurity regions 347 to 350 in the regions that have not been covered with masks 332 and low-concentration impurity regions (n⁻ regions) 337 to 340 in the regions covered with the masks 332. Hence, the n-channel type TFT of the pixel portion is provided only with the low-concentration impurity regions (LDD regions) that do not overlap with the gate electrodes. In the region to be a capacitance portion of the pixel portion later, a high-concentration impurity region 350 is formed in a self-aligning manner and low-concentration impurity regions (n⁻ regions) 341 and 342 are formed below the tapered portions.

By the second doping process, an impurity element that imparts n-type conductivity is added to the high-concentration impurity regions 343 to 350 at a concentration in the range of $3\times10^{19}$ to $1\times10^{21}/cm^3$.

Furthermore, one conductive type impurity element (phosphorus) may be added before and after the second doping process. In this case, further gettering can be implemented by the heat treatment carried out later. Furthermore, in such a case, it is desirable to use masks that allows the one conductive type impurity element to be added to the end portions of all the semiconductor films in the second doping process.

Next, the masks 329 to 332 are removed and then a third doping process is carried out with the semiconductor films to be active layers of the n-channel type TFTs later covered with masks 351 to 353 made of a resist (FIG. 4B). A p-type impurity element is added through the tapered portions and thereby regions (regions 354b to 357b overlapping with the gate electrodes (GOLD regions)) containing the p-type impurity element at a low concentration are formed. By this third doping process, regions 354a to 357a are formed that contain the n-type impurity element at a low concentration and the p-type impurity element at a high concentration. Although the regions 354a to 357a contain phosphorus at a low concentration, there arises no problem since the regions 354a to 357a function as source and drain regions of the p-channel type TFTs through the implementation of the doping process which allows the concentration of boron to be $6\times10^{19}$ to $6\times10^{20}/cm^3$.

In this embodiment, the first, second, and third doping processes are carried out in this order. However, their order is not particularly limited and may be changed freely.

Next, the masks 351 to 353 made of a resist are removed and then a first interlayer insulating film 358 is formed. This first interlayer insulating film 358 is formed of an insulating film containing silicon that is formed to have a thickness of 10 to 200 nm by the plasma CVD method or sputtering technique.

Subsequently, a step of activating the impurity elements added to the respective semiconductor films is carried out as shown in FIG. 4C. This activation step is carried out by YAG or excimer laser irradiation from the rear face. With the irradiation from the rear face, the impurity regions overlapping with the gate electrodes with the insulating film interposed therebetween can be activated.

In the present embodiment, an example was described in which the first interlayer insulating film was formed before the activation. However, the first interlayer insulating film may be formed after the activation.

Next, a second interlayer insulating film 359 formed of a silicon nitride film is formed and then a heat treatment (at 300 to 550° C. for 1 to 12 hours) is carried out. Thus, a step of hydrogenating the semiconductor films is carried out. In the present embodiment, the heat treatment was carried out in a nitrogen atmosphere at 410° C. for one hour. This step is a step of terminating dangling bonds in the semiconductor films with hydrogen contained in the second interlayer insulating film 359. The semiconductor films can be hydrogenated irrespective of the presence of the first interlayer insulating film. As another hydrogenation method, plasma hydrogenation (using hydrogen excited by plasma) may be carried out.

Next, a third interlayer insulating film 360 made of an organic insulating material is formed on the second interlayer insulating film 359. In the present embodiment, an acrylic resin film with a thickness of 1.6 µm was formed. Next, patterning is carried out to form contact holes reaching the respective high-concentration impurity regions. In the present embodiment, a plurality of etching processes were carried out. In this embodiment, after the third interlayer insulating film was etched with the second interlayer insulating film used as an etching stopper, the second interlayer insulating film was etched with the first interlayer insulating film used as an etching stopper and then the first interlayer insulating film was etched.

Next, electrodes 361 to 369 are formed that are electrically connected with the respective high-concentration impurity regions, and a pixel electrode 370 is formed that is electrically connected with the high-concentration impurity region 349. As the material for these electrodes and pixel electrode, materials having excellent reflectivity are used including films containing Al or Ag as a main component, laminated films including such films, and the like.

Figure 5:
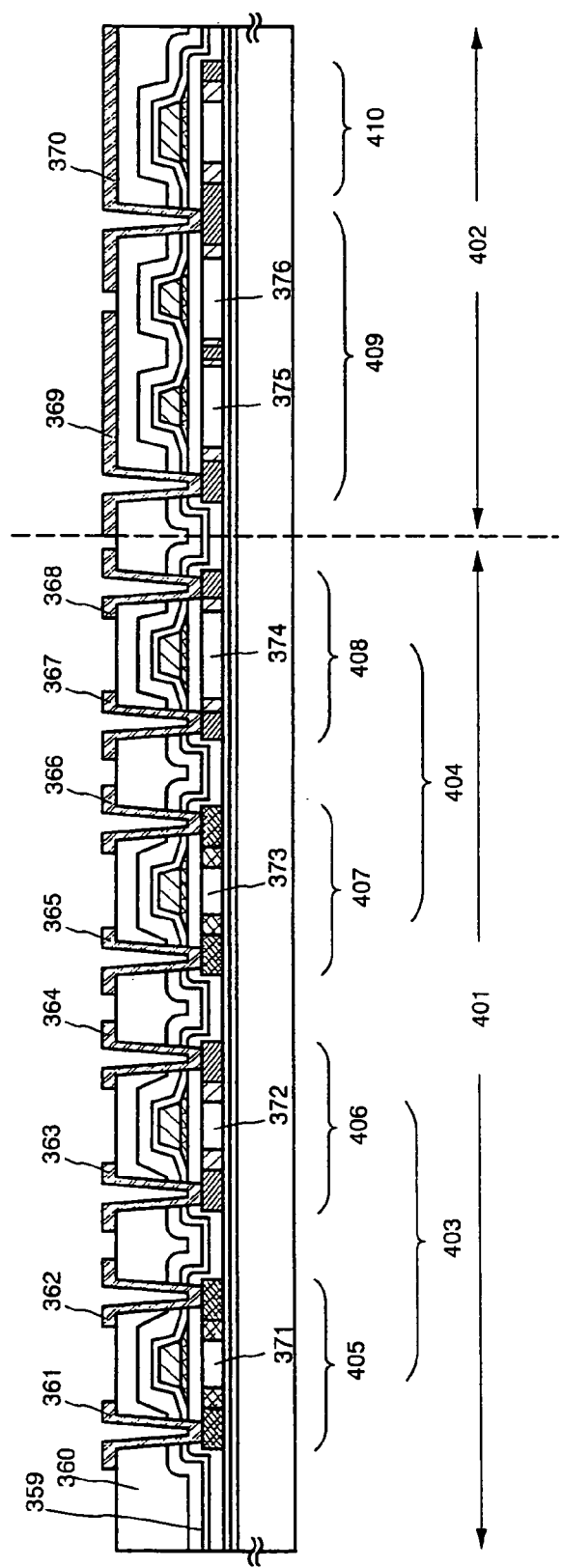
FIG. 5 is a drawing showing a step of manufacturing the active matrix substrate.

As described above, a driver circuit 401 having a logic circuit portion 403 including an n-channel type TFT 406 with a channel region 372 and a p-channel type TFT 405 with a channel region 371 and a sampling circuit portion 404 including an n-channel type TFT 408 with a channel region 374 and a p-channel type TFT 407 with a channel region 373, and a pixel portion 402 having a pixel TFT formed of an n-channel type TFT 409 with channel regions 375 and 376 and a storage capacitor 410 can be formed on one substrate (FIG. 5).

In the present embodiment, the n-channel type TFT 409 has a structure having two channel formation regions between the source and drain regions (a double-gate structure). However, the structure of the present embodiment is not limited to the double-gate structure but may be a single-gate structure including one channel formation region or a triple-gate structure including three channel formation regions.

The present embodiment is characterized in that high-concentration impurity regions are produced individually to be suitable for the respective circuits in a self-aligning manner or using masks by the second doping process. The n-channel type TFTs 406, 408, and 409 each have a lightly doped drain (LDD) structure as a TFT structure. In addition, the n-channel type TFT 406 has a so-called "GOLD structure" in which LDD regions are placed to overlap with the corresponding gate electrode with the gate insulating film interposed therebetween. The n-channel type TFTs 408 and 409 each have a structure provided only with regions (LDD regions) that do not overlap with the corresponding gate electrode. In the present specification, each low-concentration impurity region ($n^-$ region) overlapping with the corresponding gate electrode with the insulating film interposed therebetween is referred to as the "GOLD region" and each low-concentration impurity region ($n^-$ region) that does not overlap with the corresponding gate electrode is referred to as the "LDD region". The width in the channel direction of the regions (LDD regions) that do not overlap with the corresponding gate electrode can be set freely through suitable replacement of the masks employed in the second doping process. Furthermore, when the conditions of the first doping process are changed to allow the impurity element to be added to the portions below the tapered portions, the n-channel type TFTs 408 and 409 can be formed to have a structure including both the regions (GOLD regions) overlapping with the corresponding gate electrode and the regions (LDD regions) that do not overlap with the corresponding gate electrode.

In the present embodiment, for the formation of the semiconductor layers 302 to 306, the method of forming the semiconductor layers according to the embodiment mode 2 can be applied instead of the method according to the embodiment mode 1.

Embodiment 2

In the present embodiment, crystallization was implemented by a method that was different from that employed in the embodiment mode 1, which is shown in FIGS. 6A to 6D as an example.

Figure 6A:
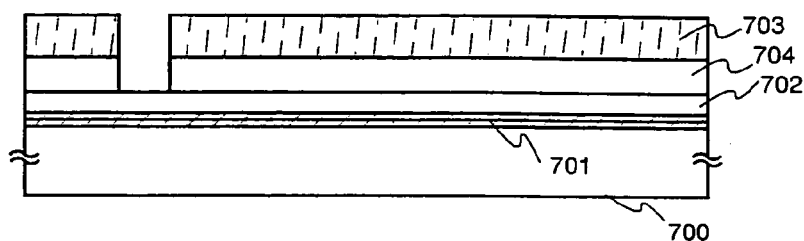
FIGS. 6A to 6D are drawings illustrating crystallization of a semiconductor film.

First, a base insulating film 701 and an amorphous semiconductor film 702 are formed sequentially on a substrate 700 as in the embodiment mode 1. Next, an insulating film containing silicon as a main component is formed and then a mask 703 made of a resist is formed. Subsequently, the insulating film is removed selectively using the mask 703 and thereby a mask 704 is formed (FIG. 6A).

Figure 6B:
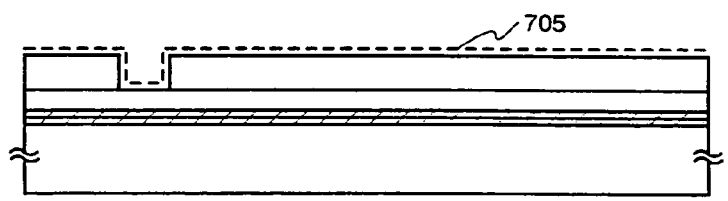
Figure 6C:
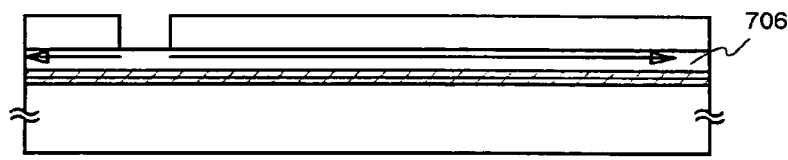

Next, the mask 703 is removed and then a metal-containing film 705 is formed. Here, a metal element is added selectively to an amorphous semiconductor film located in a region that is not covered with the mask 704 (FIG. 6B).

Next, a heat treatment is carried out for crystallization and thereby a semiconductor film 706 having a crystalline structure is formed. As this heat treatment, a heat treatment in an electric furnace or strong light irradiation may be employed. When the heat treatment in an electric furnace is employed, the heat treatment is carried out at 500° C. to 650° C. for 4 to 24 hours, for example, it may be carried out at 550° C. for four hours. By the heat treatment, nickel diffuses in the directions indicated by the arrows shown in FIG. 6C and crystallization progresses. Thus, by this heat treatment, the amorphous semiconductor film that is in contact with the mask 704 formed of the insulating film is crystallized due to the effect of nickel.

Figure 6D:
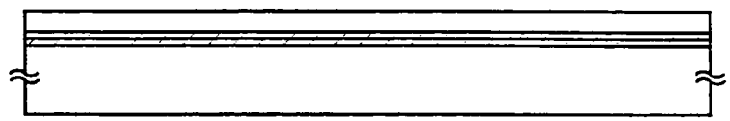

Next, the mask 704 is removed and thus a semiconductor film 706 with a crystalline structure is obtained (FIG. 6D).

The steps to be carried out hereafter may be carried out according to the embodiment mode 1 or embodiment 1. FIG. 6D corresponds to FIG. 1B.

In addition, the present embodiment can be combined with the embodiment mode 2.

Embodiment 3

In this embodiment, a process for manufacturing an active matrix liquid crystal display device using the active matrix substrate manufactured in Embodiment 1 will be described. The description is made with reference to FIG. 7.

First, after the active matrix substrate with the state of FIG. 5 is obtained according to Embodiment 1, an alignment film is formed on the active matrix substrate of FIG. 5 to perform a rubbing process. Note that, in this embodiment, before the formation of the alignment film, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate is prepared. A color filter in which a colored layer and a light shielding layer are arranged corresponding to each pixel is provided in this opposing substrate. Also, a light shielding layer is provided in a portion of a driver circuit. A leveling film for covering this color filter and the light shielding layer is provided. Next, a counter electrode made of a transparent conductive film is formed in a pixel portion on the leveling film, and then an alignment film is formed on the entire surface of the opposing substrate to perform a rubbing process.

Then, the active matrix substrate in which the pixel portion and the driver circuit are formed and the opposing substrates are adhering to each other by using a sealing member. The filler is mixed with the sealing member, and two substrates are adhering to each other with a uniform interval by this filler and the columnar spacer. After that, a liquid crystal material is injected into a space between both substrates and then completely encapsulated by a sealing member (not shown). A known liquid crystal material may be used as the liquid crystal material. Thus, the active matrix liquid crystal display device is completed. If necessary, the active matrix substrate or the opposing substrate is cut with a predetermined shape. Also, a polarization plate and the like are suitably provided using a known technique. And, an FPC is adhering to the active matrix liquid crystal display device using a known technique.

A structure of a liquid crystal module thus obtained will be described using a top view of FIG. 7. Note that the same reference symbols are used for portions corresponding to those of FIG. 5.

Figure 7:
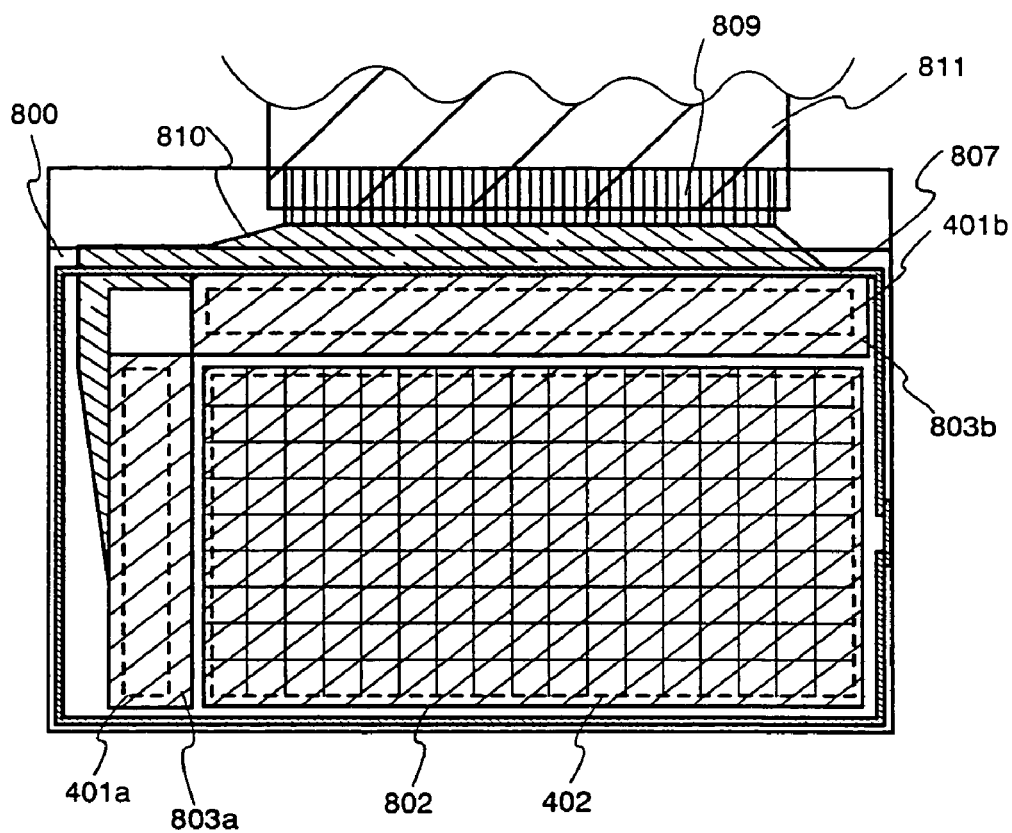
FIG. 7 is a top view of an active matrix type liquid crystal display device.

The top view of FIG. 7 shows the state that the active matrix substrate and the opposing substrate 800 are adhering to each other through the sealing member 807. Over the active matrix substrate, an external input terminal 809 to which the pixel portion, the driver circuit, and the FPC (flexible printed circuit) 811 are adhering, a wiring 810 for connecting the external input terminal 809 with an input portion of the respective circuits, and the like are formed. Also, the color filter and the like are formed in the opposing substrate 800.

A light shielding layer 803a is provided in the opposing substrate side so as to overlap with a gate wiring side driver circuit 401a. Also, a light shielding layer 803b is provided in the opposing substrate side so as to overlap with a source wiring side driver circuit 401b. In a color filter 802 which is provided over the opposing substrate side on a pixel portion 402, a light shielding layer and colored layers for respective colors red color (R), green color (G), and blue color (B) are provided corresponding to each pixel. Actually, a color display is formed using three colors, that is, the colored layer for the red color (R), the colored layer for the green color (G), and the colored layer for the blue color (B). Note that the colored layers for respective colors are arbitrarily arranged.

Here, for a color display, the color filter 802 is provided over the opposing substrate. However, the present invention is not particularly limited to this case, and in manufacturing the active matrix substrate, the color filter may be formed over the active matrix substrate.

Also, in the color filter, the light shielding layer is provided between adjacent pixels such that a portion except for a display region is shielded. The light shielding layers 803a and 803b are provided in a region covering the driver circuit. However, when the liquid crystal display device is incorporated into an electronic device as a display portion thereof, the region covering the driver circuit is covered with a cover. Thus, the color filter may be constructed without the light shielding layer. In manufacturing the active matrix substrate, the light shielding layer may be formed over the active matrix substrate.

Also, without providing the light shielding layer, the colored layers composing the color filter may be suitably arranged between the opposing substrate and the counter electrode such that light shielding is made by a lamination layer laminated with a plurality of layers. Thus, the portion except for the display region (gaps between pixel electrodes) and the driver circuit may be light shielded.

Also, the FPC 811 which is composed of the base film and the wiring is adhering to the external input terminal by using an anisotropic conductive resin. Further, a reinforced plate is provided to increase a mechanical strength.

The liquid crystal module manufactured above can be used as the display portion of various electronic equipments.

The above-mentioned liquid crystal module can be either AC driving or DC driving.

This embodiment can be freely combined with either one of Embodiment mode 1, Embodiment mode 2, Embodiment 1 and Embodiment 2.

Embodiment 4

Figure 8:
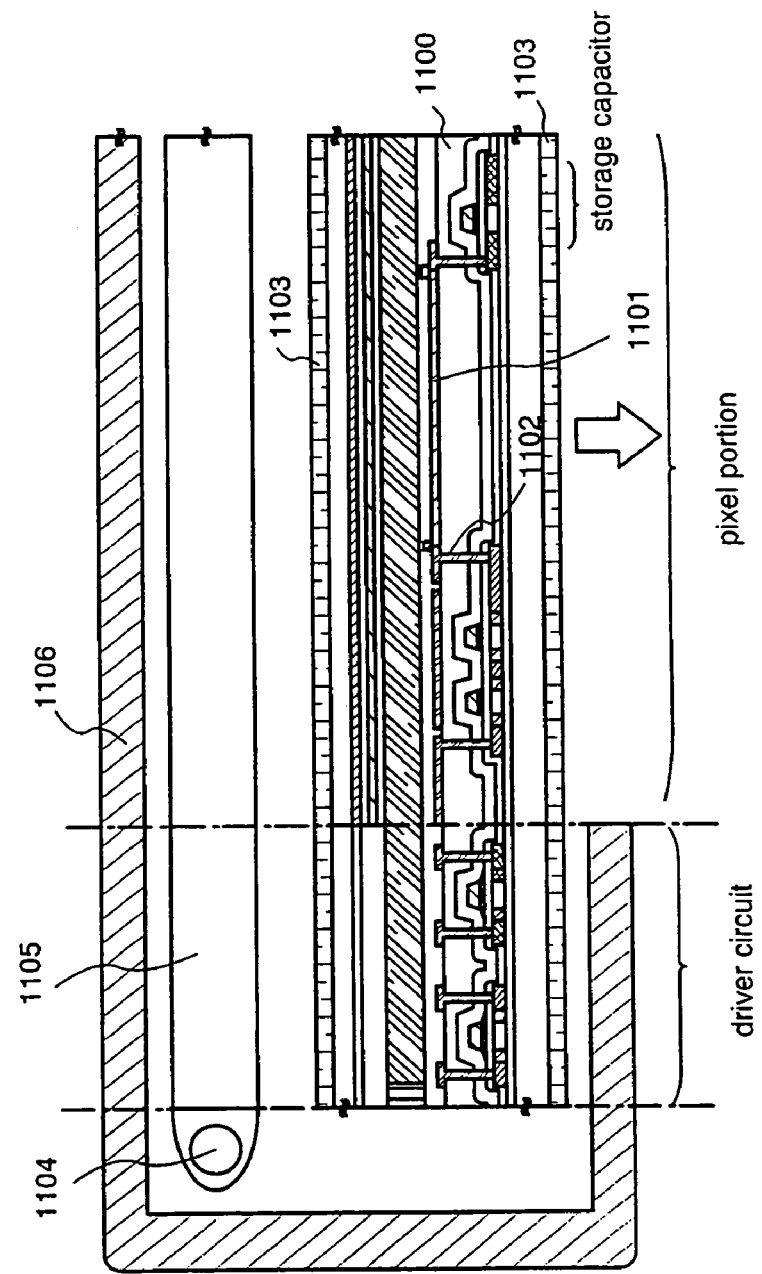
FIG. 8 is a drawing illustrating an example of a transmission type of an active matrix type liquid crystal display device.

Embodiments 1 or 3 show an exemplary reflection type display device in which a pixel electrode is made of a metal material with reflectivity. In this embodiment, an exemplary transmission type display device is shown in FIG. 8, in which a pixel electrode is made of a conductive film with light transparency.

The processes up to the process of forming an interlayer insulating film 1100 are the same as those in Embodiment 1. Therefore, these processes will be omitted here. After the interlayer insulating film 1100 is formed in accordance with Embodiment 1, a pixel electrode 1101 made of a conductive film with light transparency is formed. As the conductive film having light transparency, ITO (indium tin oxide alloy), $In_2O_3$ (ZnO), zinc oxide (ZnO), or the like may be used.

Thereafter, contact holes are formed in the interlayer insulating film 1100. Then, connection electrodes 1102 overlapping the pixel electrodes 1101 are formed. The connection electrode 1102 is connected to drain regions through contact holes. Furthermore, a source electrode or a drain electrode of another TFT is also formed simultaneously with the connection electrodes 1102.

Herein, an example in which all the driver circuits are formed on a substrate is shown. However, several ICs may be used in a portion of a driver circuit.

An active Matrix substrate is formed as described above. A liquid crystal module is manufactured in accordance with Embodiment 3, using the active matrix substrate, and a backlight 1104 and a light guiding plate 1105 are provided, followed by disposing a cover 1106, whereby an active matrix type liquid crystal display apparatus as shown in FIG. 8 is completed. The cover 1106 and the liquid crystal module are attached to each other with an adhesive or an organic resin. Furthermore, a substrate may be attached to a counter substrate by filling an organic resin between a frame and a substrate so as to surround the frame. Since the apparatus is of a transmission type, polarizing plates 1103 are attached to both the active matrix substrate and the counter substrate.

This embodiment can be combined with Embodiments 1 to 3.

Embodiment 5

Figure 9A:
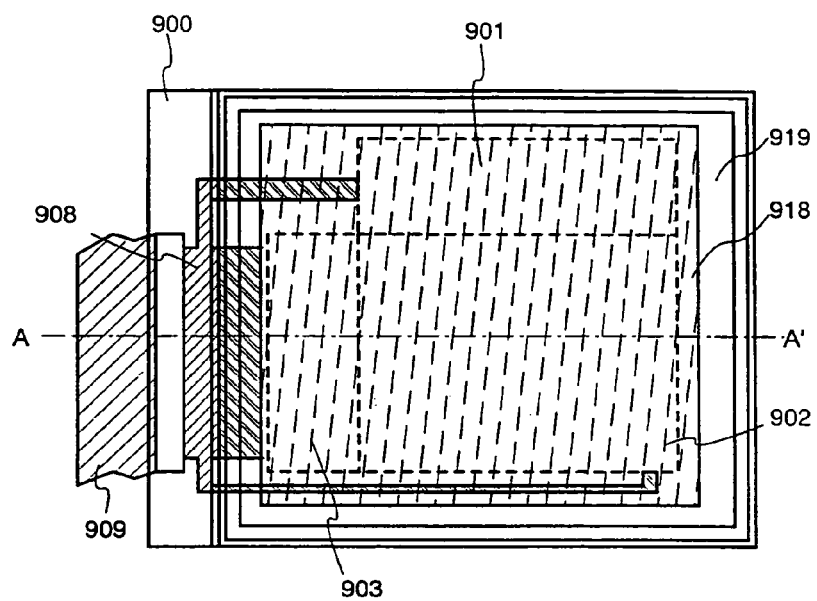
FIGS. 9A and 9B are a top view and a cross-sectional view, respectively, showing an EL module.
Figure 9B:
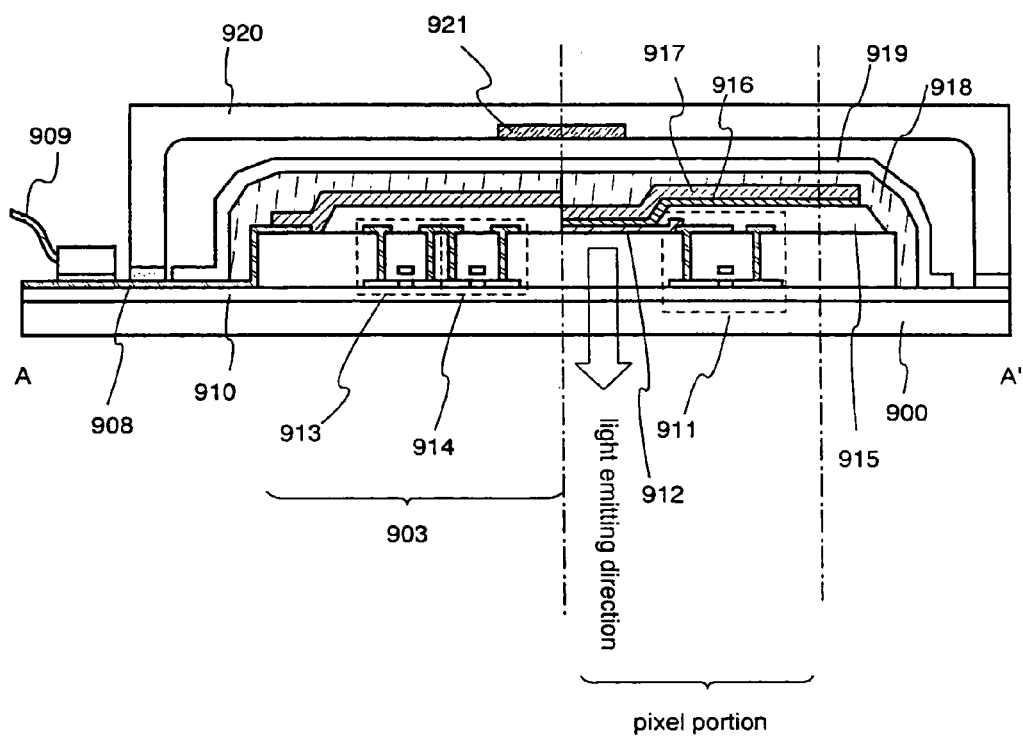

An example of manufacturing a light emitting display device provided with EL (electroluminescence) elements is shown in FIGS. 9A and 9B in Embodiment 5.

FIG. 9A is an upper surface diagram showing an EL module, and FIG. 9B is a cross sectional diagram of FIG. 9A cut along a line A-A'. A pixel portion 902, a source side driver circuit 901, and a gate side driver circuit 903 are formed on a substrate 900 having an insulating surface (for example, a substrate such as a glass substrate, a crystallized glass substrate, or a plastic substrate). The pixel portion and the driver circuits can be obtained in accordance with the above-mentioned embodiments. Further, reference numeral 918 denotes a sealing material, and reference numeral 919 denotes a DLC film. The pixel portion and the driver circuit portion are covered with the sealing material 918, and the sealing material is covered with a protective film 919. In addition, sealing is performed by a cover material 920 using an adhesive. It is preferable that the cover material 920 be the same substance as the substrate 900 in order to be able to withstand changes in shape due to heat and external forces, for example a glass substrate, and a concave shape (depth 3 to 10 μm) is produced as shown in FIGS. 9A and 9B by a method such as sand blasting. In addition, it is preferable to form a concave portion (depth 50 to 200 μm) in which it is possible to place a drying agent 921. Furthermore, if a multi-faced EL module is manufactured, then sectioning may be performed, using means such as a $CO_2$ laser, after joining the substrate and the cover material so that side faces become uniform.

Note that reference numeral 908 denotes a wiring for transmitting input signals to the source side driver circuit 901 and to the gate side driver circuit 903. Video signals and clock signals are received from an FPC (flexible printed circuit) 909 as an external input terminal. Note that although only the FPC is shown in the figures here, a printed wiring board (PWB) may also be attached to the FPC. The term light emitting device in this specification includes not only the light emitting device itself, but also a state in which an FPC or a PWB are attached thereto.

The cross sectional structure is explained next using FIG. 9B. An insulating film 910 is formed on the substrate 900, and the pixel portion 902 and the gate side driver circuit 903 are formed on upper side of the insulating film 910. The pixel portion 902 is formed by a plurality of pixels containing a current control TFT 911 and a pixel electrode 912 that is electrically connected to the drain of the current control TFT 911. Further, the gate side driver circuit 903 is formed using a CMOS circuit in which an n-channel TFT 913 and a p-channel TFT 914 are combined.

The TFTs (including those indicated by reference numerals 911, 913, and 914) may be manufactured in accordance with Embodiment 1 above.

The pixel electrode 912 functions as an anode of an EL element. Further, banks 915 are formed at both edges of the pixel electrode 912, and an EL layer 916 and an EL element cathode 917 are formed on the pixel electrode 912.

An EL layer (a layer for emitting light and for carrier mobility in order to emit light) in which a light emitting layer, an electric charge transporting layer, and an electric charge injecting layer are freely combined may be formed as the EL layer 916. For example, low molecular weight EL materials or high molecular weight EL materials may be used. Furthermore, thin films made from a light emitting material that emits light by singlet excitation (fluorescence) (singlet compound), or a thin film made from a light emitting material that emits light by triplet excitation (phosphorescence) (triplet compound) can be used. It is also possible to use inorganic materials such as silicon carbide to form the charge transporting layers or the charge injecting layers. Known materials can be used for these organic EL materials and inorganic materials.

The cathode 917 functions as a common wiring for all pixels, and is electrically connected to the FPC 909 via a connection wiring 908. In addition, elements contained in the pixel portion 902 and the gate side driver circuit 903 are all covered with the cathode 917, the sealing material 918, and the protective film 919.

Note that it is preferable to use a material which is as transparent or semi-transparent as possible with respect to visible light, as the sealing material 918. Further, it is also preferable that the sealing material 918 be a material that allows as little moisture and oxygen as possible to pass therethrough.

As shown in FIG. 9, it is preferable to, at least, form the protective film 919 made from a material such as a DLC film on a surface (exposed surface) of the sealing material 918 after completely enclosing the light emitting elements using the sealing material 918. The protective film may also be formed over the entire surface of the substrate, including the back surface. It is necessary to take care here such that the protective film is not formed in portions at which the external input terminal (FPC) is formed. A mask may be used so that the protective film is not formed in these portions, or the external input terminal portions may be covered with tape, such as Teflon tape, used as a masking tape in a CVD apparatus.

The EL elements can be completely shut off from the outside by thus enclosing the EL elements using the sealing material 918 and the protective film, so that the incursion of substances such as moisture and oxygen from the outside which promote deterioration of the EL layer by inducing oxidation thereof can be prevented. A light emitting device having high reliability can therefore be obtained.

Figure 10:
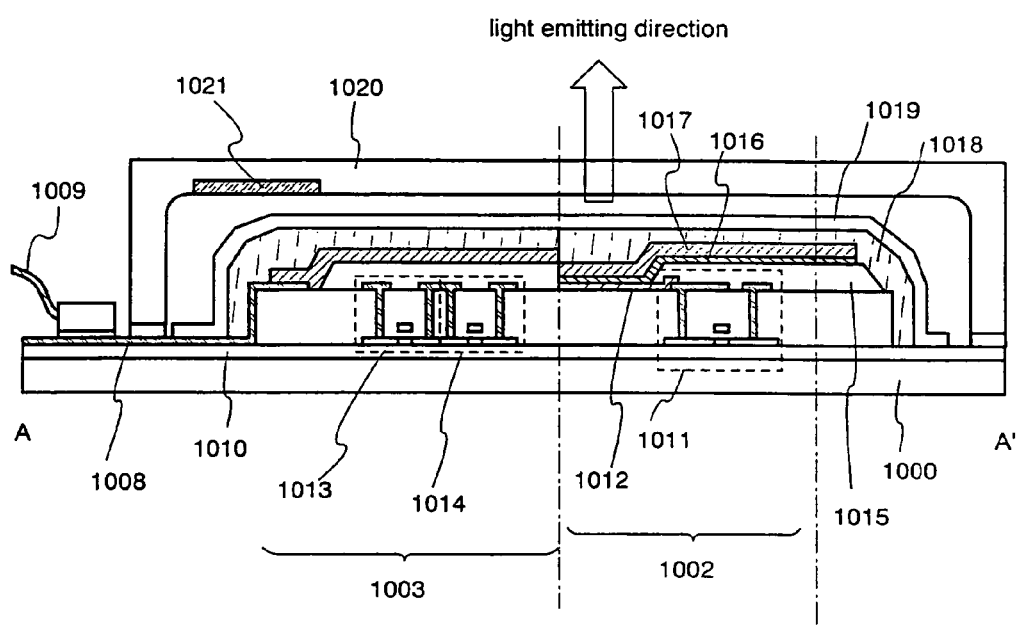
FIG. 10 is a cross-sectional view showing an EL module.

A structure in which the pixel electrode is used as the cathode, and the EL layer and the anode are laminated may also be used. In this case light is emitted in a direction opposite that of FIGS. 9A and 9B. One example of such a structure is shown in FIG. 10. Note that an upper surface diagram is identical to that of FIG. 9A, and it is therefore omitted.

The cross sectional structure shown in FIG. 10 is explained below. In addition to a glass substrate or a quartz substrate, a semiconductor substrate or a metallic substrate can also be used as a substrate 1000. An insulating film 1010 is formed on the substrate 1000, and a pixel portion 1002 and a gate side driver circuit 1003 are formed on the insulating film 1010. The pixel portion 1002 is formed by a plurality of pixels containing a current control TFT 1011 and a pixel electrode 1012 which is electrically connected to a drain of the current control TFT 1011. The gate side driver circuit 1003 is formed using a CMOS circuit in which an n-channel TFT 1013 and a p-channel TFT 1014 are combined.

The pixel electrode 1012 functions as a cathode of the EL element. Further, banks 1015 are formed at both edges of the pixel electrode 1012, and an EL layer 1016 and an EL element anode 1017 are formed on the pixel electrode 1012.

The anode 1017 functions as a common wiring for all pixels, and is electrically connected to an FPC 1009 via a connection wiring 1008. In addition, all elements contained in the pixel portion 1002 and the gate side driver circuit 1003 are covered with a sealing material 1018 and by a protective film 1019 made from a material such as DLC. The covering material 1020 and the substrate 1000 are joined by an adhesive. Further, a convex portion is formed in the covering material, and a drying agent 1021 is disposed in the convex portion.

Note that it is preferable to use a material which is as transparent or semi-transparent as possible with respect to visible light, as the sealing material 1018. Further, it is also preferable that the sealing material 1018 be a material which allows as little moisture and oxygen as possible to pass therethrough.

The pixel electrode is used as the cathode, and the EL layer and the anode are laminated on top in FIG. 10. Thus, the direction of light emitted becomes the direction of the arrow shown in FIG. 10.

Note that it is possible to combine the present embodiment with Embodiments 1 to 4.

Embodiment 6

Figure 11:
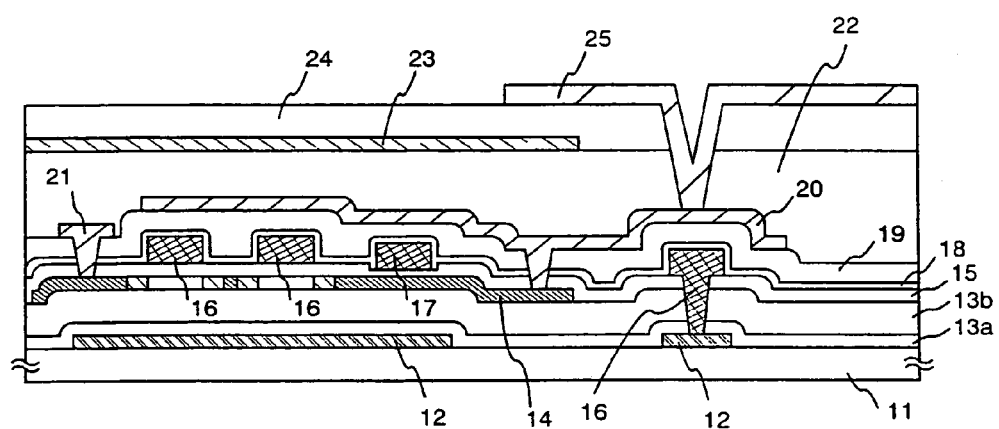
FIG. 11 is a cross-sectional view showing an active matrix substrate.

This embodiment shows an example different from Embodiment 1 with reference of FIG. 11.

First, a conductive film is formed on a substrate 11 having an insulating surface, followed by patterning, whereby scanning lines 12 are formed. The scanning lines 12 function as light blocking layers for protecting an active layer to be formed from light. Herein, a quartz substrate was used as the substrate 11, and a layered structure of a polysilicon film (thickness: 50 nm) and a tungsten silicide (W—Si) film (thickness: 100 nm) were used as the scanning lines 12. The polysilicon film protects the substrate 11 from contamination due to tungsten silicide.

Then, insulating films 13a and 13b covering the scanning lines 12 are formed to a thickness of 100 to 1000 nm (typically, 300 to 500 nm). Herein, a silicon oxide film (thickness: 100 nm) formed by CVD and a silicon oxide film (thickness: 280 nm) formed by LPCVD were stacked.

An amorphous semiconductor film was formed to a thickness of 10 to 100 nm. Herein, an amorphous silicon film (thickness: 69 nm) was formed by LPCVD method. Then, crystallization, gettering, and patterning were conducted using the technique described in Embodiment modes 1 or 2 as a technique of crystallizing the amorphous semiconductor film to remove unnecessary portions of a crystalline silicon film, whereby a semiconductor layer 14 is formed.

Then, in order to form a storage capacitor, a mask is formed, and a part (region where a storage capacitor is to be formed) of the semiconductor layer 14 is doped with phosphorus.

Then, the mask is removed, and an insulating film covering the semiconductor layer 14 is formed. Thereafter, the mask is formed, and the insulating film on the region where a storage capacitor is to be formed is selectively removed.

The mask is removed and thermal oxidation is conducted, whereby an insulating film (gate insulating film) 15 is formed. Due to the thermal oxidation, the final thickness of the gate insulating film 15 became 80 nm. An insulating film thinner than that of the other region was formed on the region where a storage capacitor is to be formed.

Then, channel doping for adding a p-type or n-type impurity element to regions to be channel regions of TFTs in a low concentration was conducted over the entire surface or selectively. The purpose for this channel doping is to control a threshold voltage of a TFT. Herein, boron was added by ion doping in which diborane ($B_2H_6$) was excited with plasma without mass separation. Needless to say, ion implantation (in which mass separation is conducted) may be used.

Next, a mask is formed on the insulating film 15, and the insulating films 13a, 13b, and a contact hole reaching the scanning line 12 is formed. After formation of the contact hole, the mask is removed.

A conductive film is formed, followed by patterning, whereby gate electrodes 16 and capacitive wiring 17 are formed. Herein, a layered structure of a silicon film (thickness: 150 nm) doped with phosphorus and tungsten silicide (thickness: 150 nm) was used. The storage capacitor is composed of the insulating film 15 as a dielectric, the capacitive wiring 17, and a part of the semiconductor layer.

Phosphorus is added in a low concentration in a self-alignment manner, using the gate electrode 16 and the capacitive wiring 17 as a mask. The concentration of phosphorus in regions where phosphorus is added in a low concentration is regulated to be $1\times10^{16}$ to $5\times10^{18}$ atoms/cm$^3$, typically $3\times10^{17}$ to $3\times10^{18}$ atoms/cm$^3$.

Then, a mask is formed, and phosphorus is added in a high concentration, whereby high concentration impurity regions to be a source region or a drain region are formed. The concentration of phosphorus in the high concentration impurity regions is regulated to $1\times10^{20}$ to $1\times10^{21}$ atoms/cm$^3$ (typically, $3\times10^{19}$ to $3\times10^{20}$/cm$^3$). Regions of the semiconductor layer 14 overlapping the gate electrodes 16 become channel formation regions, and regions covered with the mask become low concentration impurity regions that function as LDD regions. After addition of the impurity element, the mask is removed.

Then, in order to form a p-channel TFT used in a driver circuit to be formed on the same substrate as that of pixels, a region to be an n-channel TFT is covered with a mask, and boron is added to form a source region or a drain region.

After the mask 412 is removed, a passivation film 18 covering the gate electrode 16 and the capacitive wiring 17 is formed. Herein, a silicon oxide film was formed at a thickness of 70 nm. Then, the n-type or p-type impurity elements added in the respective concentrations in the semiconductor layer are activated by heat treatment or irradiation with strong light. Herein, activation was conducted by irradiation with a YAG laser from the reverse surface. An excimer laser may be used, in place of a YAG laser.

Then, an interlayer insulating film 19 made of an organic resin material is formed. Herein, an acrylic resin film having a thickness of 400 nm was used. Then, a contact hole reaching the semiconductor layer is formed, and an electrode 20 and a source wiring 21 are formed. In this embodiment, the electrode 20 and the source wiring 21 were composed of a three-layered structure formed by continuously forming a Ti film (thickness: 100 nm), an aluminum film containing Ti (thickness: 300 nm), and a Ti film (thickness: 150 nm) by sputtering.

After hydrogenation is conducted, an interlayer insulating film 22 made of acrylic is formed. Then, a conductive film (thickness: 100 nm) having light transparency is formed on the interlayer insulating film 22, whereby a light shielding layer 23 is formed. Then, an interlayer insulating film 24 is formed. A contact hole reaching the electrode 20 is formed. Then, a transparent conductive film (herein, indium tin oxide (ITO) film) having a thickness of 100 nm is formed, followed by patterning, to obtain a pixel electrode 25.

It should be understood that this embodiment is described merely for an illustrative purpose, and the present invention is not limited to the processes of this embodiment. For example, as each conductive film, an element selected from tantalum (Ta), titanium (Ti), molybdenum (Mo), tungsten (W), chromium (Cr), and silicon (Si), or an alloy film (typically a Mo—W alloy, a Mo—Ta alloy) obtained by combining the elements can be used. Furthermore, as each insulating film, a silicon oxide film, a silicon nitride film, a silicon oxynitride film, and a film made of an organic resin material (polyimide, acrylic, polyamide, polyimideamide, benzocyclobutene (BCB) or the like) can be used.

This embodiment can be combined with Embodiments 1 to 5.

Embodiment 7

In Embodiment 1, a top gate type TFT has been exemplified. The present invention is also applicable to a bottom gate type TFT shown in FIGS. 12A and 12B.

Figure 12A:
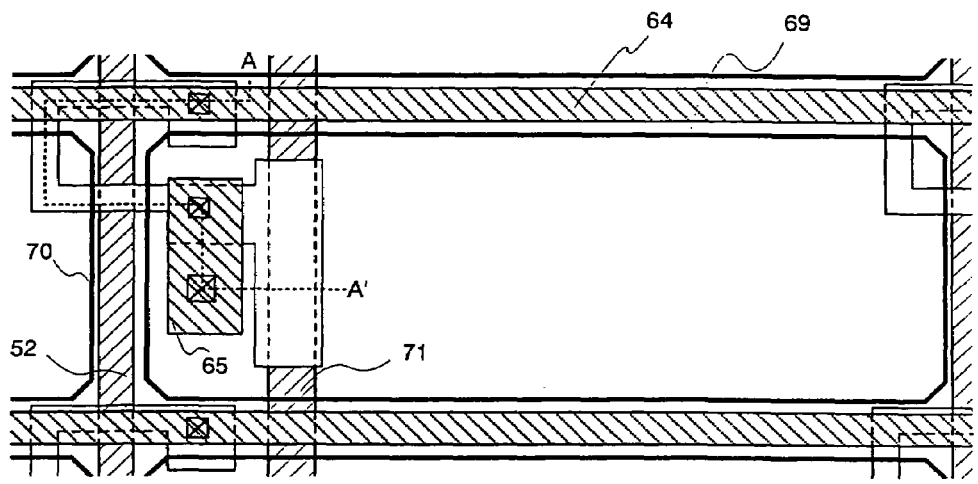
FIGS. 12A and 12B are a top view and a cross-sectional view, respectively, showing an active matrix substrate.

FIG. 12A is a top view showing an enlarged pixel in a pixel portion. In FIG. 12A, a portion taken along a dotted line A-A' corresponds to a cross-sectional structure of the pixel portion in FIG. 12B.

Figure 12B:
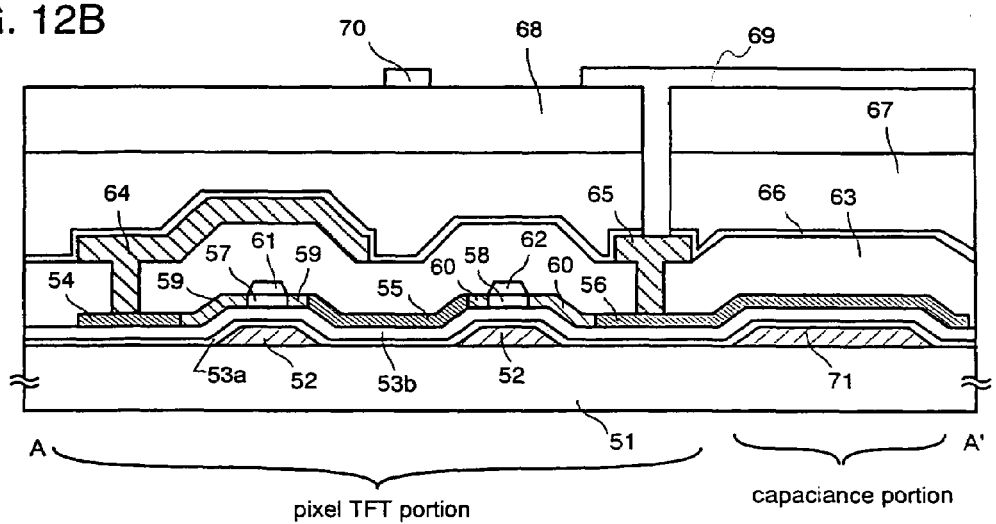

In the pixel portion shown in FIGS. 12A and 12B, a pixel TFT portion is composed of an n-channel TFT. Gate electrodes 52 are formed on a substrate 51, and a first insulating film 53a made of silicon nitride and a second insulating film 53b made of silicon oxide are provided. On the second insulating film 53b, source regions or drain regions 54 to 56 as an active layer, channel formation regions 57 and 58, and LDD regions 59 and 60 between the source region or drain region and the channel formation region are formed. The channel formation regions 57 and 58 are protected by insulating layers 61 and 62. After contact holes are formed in the first interlayer insulating film 63 covering the insulating layers 61, 62, and the active layer, a wiring 64 is connected to the source region 54 and a wiring 65 is connected to the drain region 56. A passivation film 66 is formed on the first interlayer insulating film 63. A second interlayer insulating film 67 is further formed on the passivation film 66. Furthermore, a third interlayer insulating film 68 is formed on the second interlayer insulating film 67. A pixel electrode 69 made of a transparent conductive film made of ITO, $SnO_2$ or the like is connected to the wiring 65. Reference numeral 70 denotes a pixel electrode adjacent to the pixel electrode 69.

In this embodiment, an active layer is formed in accordance with Embodiment modes 1 or 2.

In this embodiment, a channel stop type bottom gate type TFT has been described as an example. However, the present invention is not particularly limited thereto.

In this embodiment, a gate wiring of a pixel TFT in the pixel portion has a double gate structure. However, in order to reduce variation in an OFF current, a multi gate structure such as a triple gate structure may be used. Furthermore, in order to enhance an opening ratio, a single gate structure may be used.

Furthermore, a capacitor portion of the pixel portion is composed of the first and second insulating films as a dielectric, capacitive wiring 71, and the drain region 56.

The pixel portion shown in FIGS. 12A and 12B is an example, and the pixel portion is not particularly limited to the above-mentioned configuration.

This embodiment can be combined with either one of Embodiments 1 to 4.

Embodiment 8

The driver circuit portion and the pixel portion fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 13A-13F, 14A-14D and 15A-15C.

Figure 13A:
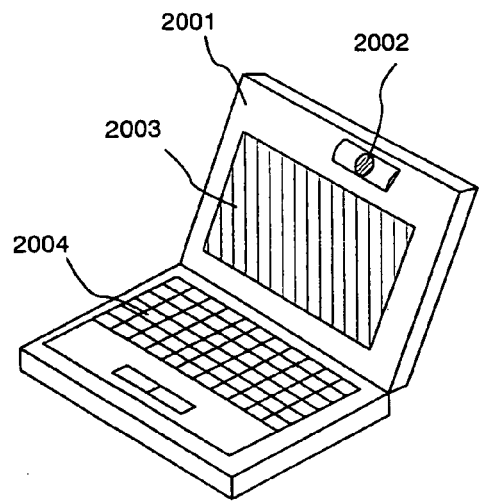
FIGS. 13A to 13F are drawings showing examples of electronic equipment.

FIG. 13A is a personal computer which comprises: a main body 2001; an image input section 2002; a display section 2003; and a key board 2004. The present invention can be applied to the display section 2003.

Figure 13B:
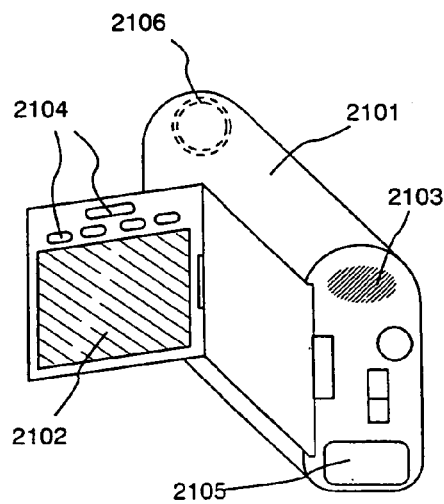

FIG. 13B is a video camera which comprises: a main body 2101; a display section 2102; a voice input section 2103; operation switches 2104; a battery 2105 and an image receiving section 2106. The present invention can be applied to the display section 2102.

Figure 13C:
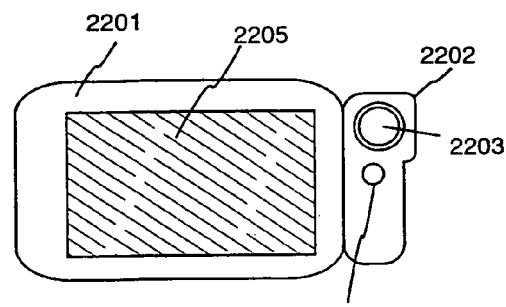

FIG. 13C is a mobile computer which comprises: a main body 2201; a camera section 2202; an image receiving section 2203; operation switches 2204 and a display section 2205. The present invention can be applied to the display section 2205.

Figure 13D:
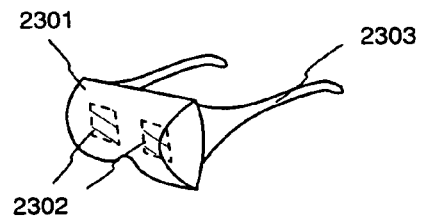

FIG. 13D is a goggle type display which comprises: a main body 2301; a display section 2302; and an arm section 2303. The present invention can be applied to the display section 2302.

Figure 13E:
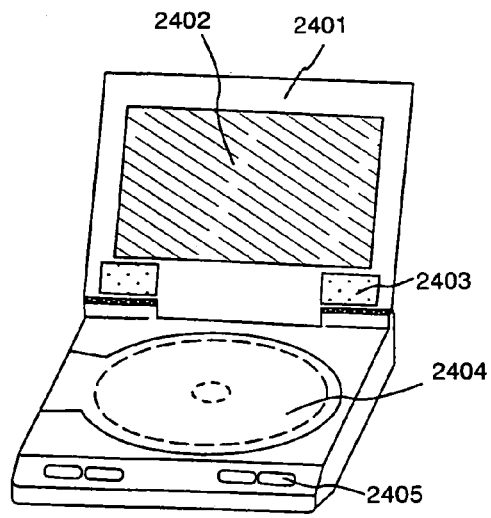
Figure 13F:
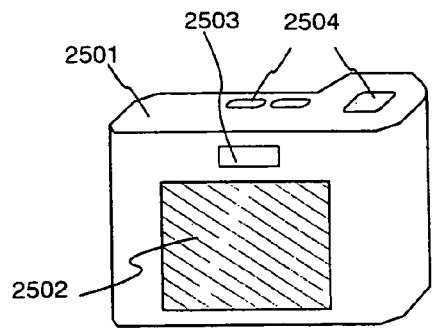

FIG. 13E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet. The present invention can be applied to the display section 2402.

IG. 13F is a digital camera which comprises: a main body 2501; a display section 2502; a view finder 2503; operation switches 2504; and an image receiving section (not shown in the figure). The present invention can be applied to the display section 2502.

Figure 14A:
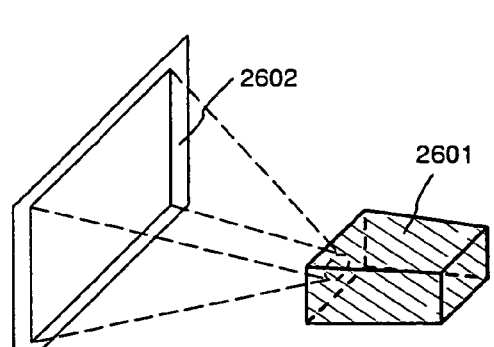
FIGS. 14A to 14D are drawings showing examples of electronic equipment.

FIG. 14A is a front type projector which comprises: a projection system 2601; and a screen 2602. The present invention can be applied to the liquid crystal module 2808 which forms a part of the projection system 2601 to complete the whole system.

Figure 14B:
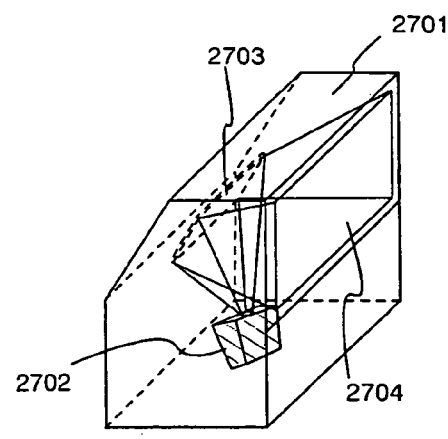

FIG. 14B is a rear type projector which comprises: a main body 2701; a projection system 2702; a mirror 2703; and a screen 2704. The present invention can be applied to the liquid crystal module 2808 which forms a part of the projection system 2702 to complete the whole system.

Figure 14C:
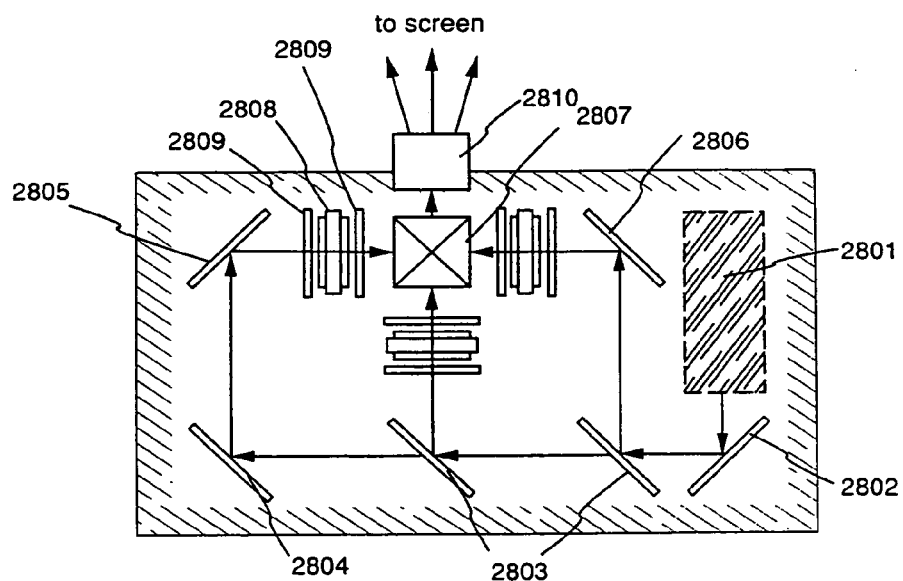

FIG. 14C is a diagram which shows an example of the structure of a projection system 2601 and 2702 in FIGS. 14A and 14B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 14C.

Figure 14D:
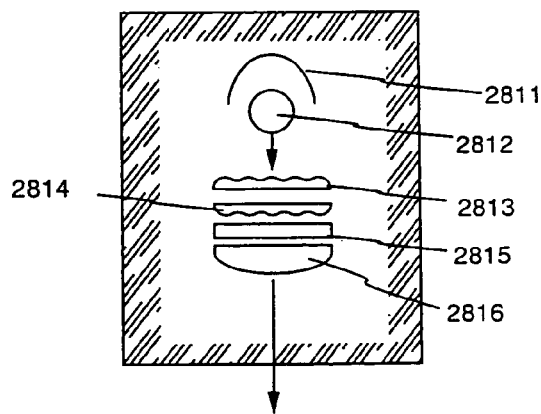

FIG. 14D is a diagram showing an example of a structure of an optical light source system 2801 in FIG. 14C. In this embodiment, the optical light source system 2801 comprises: a reflector 2811; a light source 2812; lens arrays 2813 and 2814; a polarizer conversion element 2815; and a collimator lens 2816. Note that the optical light source system shown in FIG. 14D is merely an example and the structure is not limited to this example. For instance, an operator may appropriately dispose an optical lens, a film which has a function to polarize light, a film which adjusts a phase difference or an IR film, etc.

Note that the projectors shown FIGS. 14A-14D are the cases of using a transmission type electro-optical devices, and applicable examples of a reflection type electro-optical device and an EL module are not shown.

Figure 15A:
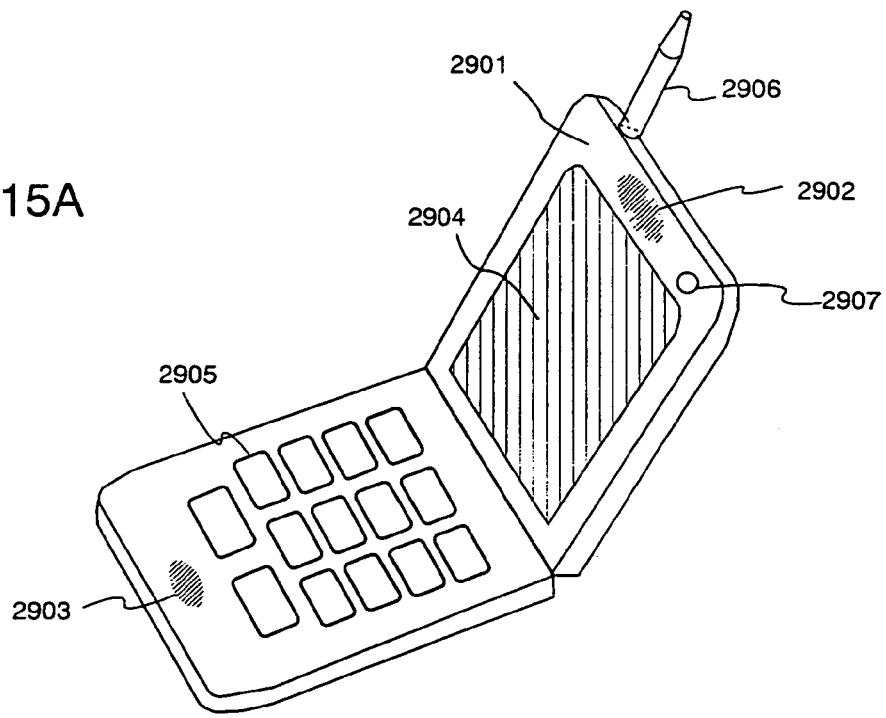
FIGS. 15A to 15C are drawings showing examples of electronic equipment.

FIG. 15A is a mobile phone which comprises: a main body 2901; a voice output section 2902; a voice input section 2903; a display section 2904; operation switches 2905; an antenna 2906; and an image input section (CCD, image sensor, etc.) 2907 etc. The present invention can be applied to the display section 2904.

Figure 15B:
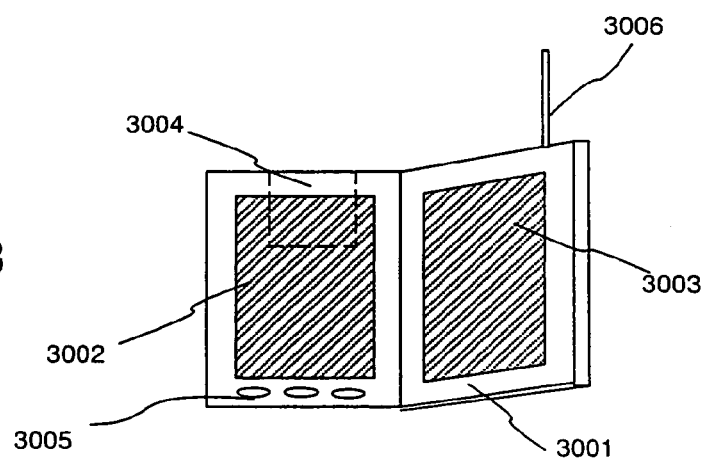

FIG. 15B is a portable book (electronic book) which comprises: a main body 3001; display sections 3002 and 3003; a recording medium 3004; operation switches 3005 and an antenna 3006 etc. The present invention can be applied to the display sections 3002 and 3003.

Figure 15C:
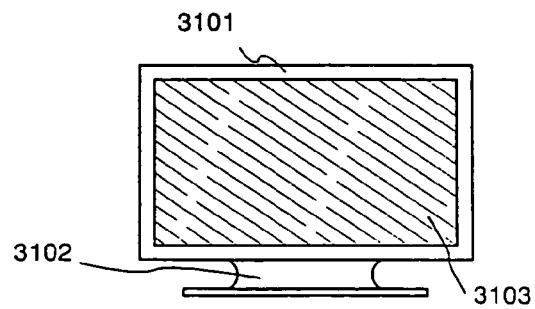

FIG. 15C is a display which comprises: a main body 3101; a supporting section 3102; and a display section. 3103 etc. The present invention can be applied to the display section 3103.

As described above, the applicable range of the present invention is very large, and the invention can be applied to electronic apparatuses of various areas. Note that the electronic devices of this embodiment can be achieved by utilizing any combination of constitutions in Embodiments 1 to 7.

According to the present invention, it is possible to achieve the reduction in number of heat treatments carried out at high temperature (at least 600° C.) and the employment of lower temperature processes (600° C. or lower), and to achieve step simplification and throughput improvement.

The invention may be embodied in other forms without departing from the spirit or essential characteristics thereof. The embodiment modes disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a semiconductor device comprising the steps of:

adding a metal element to a first semiconductor film comprising amorphous silicon over a substrate;

crystallizing the first semiconductor film to form a first crystalline semiconductor film containing oxygen at a first concentration;

forming a second semiconductor film containing oxygen at a second concentration over the first crystalline semiconductor film;

forming a third semiconductor film containing one conductive type impurity element over the second semiconductor film;

reducing a concentration of the metal element in the first crystalline semiconductor film by allowing the third semiconductor film to getter the metal element; and removing the second semiconductor film and the third semiconductor film, wherein the second concentration is larger than the first concentration.

2. A method of manufacturing a semiconductor device according to claim 1, wherein the third semiconductor film is formed by forming a semiconductor film and by adding one conductive type impurity element to the semiconductor film.

3. A method of manufacturing a semiconductor device according to claim 1, wherein the third semiconductor film containing the one conductive type impurity element is formed by one selected from the group consisting of a plasma CVD method and a low pressure thermal CVD method.

4. A method of manufacturing a semiconductor device according to claim 1, wherein the third semiconductor film containing the one conductive type impurity element is formed by sputtering technique.

5. A method of manufacturing a semiconductor device according to claim 1, further comprising a step of adding at least one element selected from the group consisting of He, Ne, Ar, Kr, Xe, O, $O_2$, H, and $H_2$ to the third semiconductor film containing the one conductive type impurity element.

6. A method of manufacturing a semiconductor device according to claim 1, wherein the third semiconductor film has an amorphous structure or a crystalline structure.

7. A method of manufacturing a semiconductor device according to claim 1, wherein the metal element is at least one element selected from the group consisting of Fe, Ni, Go, Ru, Rh, Pd, Os, Ir, Pt, Cu, and Au.

8. A method of manufacturing a semiconductor device according to claim 1, wherein the crystallizing step is carried out by a heat treatment.

9. A method of manufacturing a semiconductor device according to claim 1, wherein the crystallizing step is carried out by irradiating the first semiconductor film with a light.

10. A method of manufacturing a semiconductor device according to claim 1, wherein the crystallizing step is carried out by a heat treatment and by irradiating the first semiconductor film with a light after the heat treatment.

11. A method of manufacturing a semiconductor device according to claim 1, wherein the reducing step is carried out by a heat treatment.

12. A method of manufacturing a semiconductor device according to claim 1, wherein the reducing step is carried out by irradiating the first crystalline semiconductor film with a light.

13. A method of manufacturing a semiconductor device according to claim 1, wherein the reducing step is carried out by a heat treatment and by irradiating the first crystalline semiconductor film with a light after the heat treatment.

14. A method of manufacturing a semiconductor device according to claim 1, wherein the one conductive type impurity element is one selected from the group consisting of elements belonging to Group 15 or 13 in the periodic table.

15. A method of manufacturing a semiconductor device according to claim 12, wherein the light is emitted from one selected from the group consisting of a halogen lamp, a metal halide lamp, a xenon arc lamp, a carbon arc lamp, a high pressure sodium lamp, and a high pressure mercury lamp.

16. A method of manufacturing a semiconductor device according to claim 1, wherein the semiconductor device is an EL display device.

17. A method of manufacturing a semiconductor device according to claim 1, wherein the semiconductor device is at least one selected from the group consisting of a personal computer, a video camera, a mobile computer, a goggle-type display, a player using a recording medium, a digital camera, a projector, a mobile phone, and an electronic book.

18. A method of manufacturing a semiconductor device comprising the steps of:
   forming a first semiconductor film comprising amorphous silicon over a substrate;
   adding a crystallization promoting material on the first semiconductor film;
   crystallizing the first semiconductor film to form a first crystalline semiconductor film containing oxygen at a first concentration;
   forming a second semiconductor film containing oxygen at a second concentration over the first crystalline semiconductor film;
   forming a third semiconductor film containing one conductive type impurity element over the second semiconductor film;
   reducing a concentration of the crystallization promoting material in the first crystalline semiconductor film by using the third semiconductor film; and
   removing the second and the third semiconductor films after the reducing step,
   wherein the second concentration is larger than the first concentration.

19. A method of manufacturing a semiconductor device according to claim 18, wherein the third semiconductor film is formed by forming a semiconductor film and by adding one conductive type impurity element to the semiconductor film.

20. A method of manufacturing a semiconductor device according to claim 18, wherein the third semiconductor film containing the one conductive type impurity element is formed by one selected from the group consisting of a plasma CVD method and a low pressure thermal CVD method.

21. A method of manufacturing a semiconductor device according to claim 18, wherein the third semiconductor film containing the one conductive type impurity element is formed by sputtering technique.

22. A method of manufacturing a semiconductor device according to claim 18, further comprising a step of adding at least one element selected from the group consisting of He, Ne, Ar, Kr, Xe, O, $O_2$, H, and $H_2$ to the third semiconductor film containing the one conductive type impurity element.

23. A method of manufacturing a semiconductor device according to claim 18, wherein the third semiconductor film has an amorphous structure or a crystalline structure.

24. A method of manufacturing a semiconductor device according to claim 18, wherein the crystallization promoting material is at least one element selected from the group consisting of Fe, Ni, Co, Ru, Rh, Pd, Os, Ir, Pt, Cu, and Au.

25. A method of manufacturing a semiconductor device according to claim 18, wherein the crystallizing step is carried out by a heat treatment.

26. A method of manufacturing a semiconductor device according to claim 18, wherein the crystallizing step is carried out by irradiating the first semiconductor film with a light.

27. A method of manufacturing a semiconductor device according to claim 18, wherein the crystallizing step is carried out by a heat treatment and by irradiating the first semiconductor film with a light after the heat treatment.

28. A method of manufacturing a semiconductor device according to claim 18, wherein the reducing step is carried out by a heat treatment.

29. A method of manufacturing a semiconductor device according to claim 18, wherein the reducing step is carried out by irradiating the first crystalline semiconductor film with a light.

30. A method of manufacturing a semiconductor device according to claim 18, wherein the reducing step is carried out by a heat treatment and by irradiating the first crystalline semiconductor film with a light after the heat treatment.

31. A method of manufacturing a semiconductor device according to claim 18, wherein the one conductive type impurity element is one selected from the group consisting of elements belonging to Group 15 or 13 in the periodic table.

32. A method of manufacturing a semiconductor device according to claim 29, wherein the light is emitted from one selected from the group consisting of a halogen lamp, a metal halide lamp, a xenon arc lamp, a carbon arc lamp, a high pressure sodium lamp, and a high pressure mercury lamp.

33. A method of manufacturing a semiconductor device according to claim 18, wherein the semiconductor device is an EL display device.

34. A method of manufacturing a semiconductor device according to claim 18, wherein the semiconductor device is at least one selected from the group consisting of a personal computer, a video camera, a mobile computer, a goggle-type display, a player using a recording medium, a digital camera, a projector, a mobile phone, and an electronic book.

35. A method of manufacturing a semiconductor device comprising the steps of:
   forming a first semiconductor film comprising amorphous silicon over a substrate;
   adding a crystallization promoting material on the first semiconductor film;
   crystallizing the first semiconductor film to form a first crystalline semiconductor film containing oxygen at a first concentration;
   forming a second semiconductor film containing oxygen at a second concentration over the first crystalline semiconductor film;
   forming a third semiconductor film containing one conductive type impurity element over the second semiconductor film;
   reducing a concentration of the crystallization promoting material in the first crystalline semiconductor film by gettering the crystallization promoting material into the third semiconductor film; and
   removing the second and the third semiconductor films after the reducing step,
   wherein the second concentration is larger than the first concentration.

36. A method of manufacturing a semiconductor device according to claim 35, wherein the third semiconductor film is formed by forming a semiconductor film and by adding one conductive type impurity element to the semiconductor film.

37. A method of manufacturing a semiconductor device according to claim 35, wherein the third semiconductor film containing the one conductive type impurity element is formed by one selected from the group consisting of a plasma CVD method and a low pressure thermal CVD method.

38. A method of manufacturing a semiconductor device according to claim 35, wherein the third semiconductor film containing the one conductive type impurity element is formed by sputtering technique.

39. A method of manufacturing a semiconductor device according to claim 35, further comprising a step of adding at least one element selected from the group consisting of He, Ne, Ar, Kr, Xe, O, $O_2$, H, and $H_2$ to the third semiconductor film containing the one conductive type impurity element.

40. A method of manufacturing a semiconductor device according to claim 35, wherein the third semiconductor film has an amorphous structure or a crystalline structure.

41. A method of manufacturing a semiconductor device according to claim 35, wherein the crystallization promoting material is at least one element selected from the group consisting of Fe, Ni, Co, Ru, Rh, Pd, Os, Ir, Pt, Cu, and Au.

42. A method of manufacturing a semiconductor device according to claim 35, wherein the crystallizing step is carried out by a heat treatment.

43. A method of manufacturing a semiconductor device according to claim 35, wherein the crystallizing step is carried out by irradiating the first semiconductor film with a light.

44. A method of manufacturing a semiconductor device according to claim 35, wherein the crystallizing step is carried out by a heat treatment and by irradiating the first semiconductor film with a light after the heat treatment.

45. A method of manufacturing a semiconductor device according to claim 35, wherein the reducing step is carried out by a heat treatment.

46. A method of manufacturing a semiconductor device according to claim 35, wherein the reducing step is carried out by irradiating the first crystalline semiconductor film with a light.

47. A method of manufacturing a semiconductor device according to claim 35, wherein the reducing step is carried out by a heat treatment and by irradiating the first crystalline semiconductor film with a light after the heat treatment.

48. A method of manufacturing a semiconductor device according to claim 35, wherein the one conductive type impurity element is one selected from the group consisting of elements belonging to Group 15 or 13 in the periodic table.

49. A method of manufacturing a semiconductor device according to claim 46, wherein the light is emitted from one selected from the group consisting of a halogen lamp, a metal halide lamp, a xenon arc lamp, a carbon arc lamp, a high pressure sodium lamp, and a high pressure mercury lamp.

50. A method of manufacturing a semiconductor device according to claim 35, wherein the semiconductor device is an EL display device.

51. A method of manufacturing a semiconductor device according to claim 35, wherein the semiconductor device is at least one selected from the group consisting of a personal computer, a video camera, a mobile computer, a goggle-type display, a player using a recording medium, a digital camera, a projector, a mobile phone, and an electronic book.

52. A method of manufacturing a semiconductor device comprising the steps of:
adding a metal element to a first semiconductor film comprising amorphous silicon over a substrate;
crystallizing the first semiconductor film to form a first crystalline semiconductor film containing oxygen at a first concentration;
forming a second semiconductor film containing oxygen at a second concentration over the first crystalline semiconductor film;
forming a third semiconductor film containing one conductive type impurity element over the second semiconductor film; and
reducing a concentration of the metal element in the first crystalline semiconductor film by allowing the third semiconductor film to getter the metal element,
wherein the second concentration is larger than the first concentration.

53. A method of manufacturing a semiconductor device according to claim 52, wherein the third semiconductor film is formed by forming a semiconductor film and by adding one conductive type impurity element to the semiconductor film.

54. A method of manufacturing a semiconductor device according to claim 52, wherein the third semiconductor film containing the one conductive type impurity element is formed by sputtering technique.

55. A method of manufacturing a semiconductor device according to claim 52, further comprising a step of adding at least one element selected from the group consisting of He, Ne, Ar, Kr, Xe, O, $O_2$, H, and $H_2$ to the third semiconductor film containing the one conductive type impurity element.

56. A method of manufacturing a semiconductor device according to claim 52, wherein the third semiconductor film has an amorphous structure or a crystalline structure.

57. A method of manufacturing a semiconductor device according to claim 52, wherein the metal element is at least one element selected from the group consisting of Fe, Ni, Co, Ru, Rh, Pd, Os, Ir, Pt, Cu, and Au.

58. A method of manufacturing a semiconductor device according to claim 52, wherein the crystallizing step is carried out by a heat treatment.

59. A method of manufacturing a semiconductor device according to claim 52, wherein the crystallizing step is carried out by irradiating the first semiconductor film with a light.

60. A method of manufacturing a semiconductor device according to claim 52, wherein the crystallizing step is carried out by a heat treatment and by irradiating the first semiconductor film with a light after the heat treatment.

61. A method of manufacturing a semiconductor device according to claim 52, wherein the reducing step is carried out by a heat treatment.

62. A method of manufacturing a semiconductor device according to claim 52, wherein the reducing step is carried out by irradiating the first crystalline semiconductor film with a light.

63. A method of manufacturing a semiconductor device according to claim 52, wherein the reducing step is carried out by a heat treatment and by irradiating the first crystalline semiconductor film with a light after the heat treatment.

64. A method of manufacturing a semiconductor device according to claim 52, wherein the one conductive type impurity element is one selected from the group consisting of elements belonging to Group 15 or 13 in the periodic table.

65. A method of manufacturing a semiconductor device according to claim 62, wherein the light is emitted from one selected from the group consisting of a halogen lamp, a metal halide lamp, a xenon arc lamp, a carbon arc lamp, a high pressure sodium lamp, and a high pressure mercury lamp.

66. A method of manufacturing a semiconductor device according to claim 52, wherein the semiconductor device is an EL display device.

67. A method of manufacturing a semiconductor device according to claim 52, wherein the semiconductor device is at least one selected from the group consisting of a personal computer, a video camera, a mobile computer, a goggle-type display, a player using a recording medium, a digital camera, a projector, a mobile phone, and an electronic book.

68. A method of manufacturing a semiconductor device comprising the steps of:
 forming a first semiconductor film comprising amorphous silicon over a substrate;
 adding a crystallization promoting material on the first semiconductor film crystallizing the first semiconductor film to form a first crystalline semiconductor film containing oxygen at a first concentration;
 forming a second semiconductor film containing oxygen at a second concentration over the first crystalline semiconductor film;
 forming a third semiconductor film containing one conductive type impurity element over the second semiconductor film; and
 reducing a concentration of the crystallization promoting material in the first crystalline semiconductor film by using the third semiconductor film,
 wherein the second concentration is larger than the first concentration.

69. A method of manufacturing a semiconductor device according to claim 68, wherein the third semiconductor film is formed by forming a semiconductor film and by adding one conductive type impurity element to the semiconductor film.

70. A method of manufacturing a semiconductor device according to claim 68, wherein the third semiconductor film containing the one conductive type impurity element is formed by sputtering technique.

71. A method of manufacturing a semiconductor device according to claim 68, further comprising a step of adding at least one element selected from the group consisting of He, Ne, Ar, Kr, Xe, O, $O_2$, H, and $H_2$ to the third semiconductor film containing the one conductive type impurity element.

72. A method of manufacturing a semiconductor device according to claim 68, wherein the third semiconductor film has an amorphous structure or a crystalline structure.

73. A method of manufacturing a semiconductor device according to claim 68, wherein the crystallization promoting material is at least one element selected from the group consisting of Fe, Ni, Co, Ru, Rh, Pd, Os, Ir, Pt, Cu, and Au.

74. A method of manufacturing a semiconductor device according to claim 68, wherein the crystallizing step is carried out by a heat treatment.

75. A method of manufacturing a semiconductor device according to claim 68, wherein the crystallizing step is carried out by irradiating the first semiconductor film with a light.

76. A method of manufacturing a semiconductor device according to claim 68, wherein the crystallizing step is carried out by a heat treatment and by irradiating the first semiconductor film with a light after the heat treatment.

77. A method of manufacturing a semiconductor device according to claim 68, wherein the reducing step is carried out by a heat treatment.

78. A method of manufacturing a semiconductor device according to claim 68, wherein the reducing step is carried out by irradiating the first crystalline semiconductor film with a light.

79. A method of manufacturing a semiconductor device according to claim 68, wherein the reducing step is carried out by a heat treatment and by irradiating the first crystalline semiconductor film with a light after the heat treatment.

80. A method of manufacturing a semiconductor device according to claim 68, wherein the one conductive type impurity element is one selected from the group consisting of elements belonging to Group 15 or 13 in the periodic table.

81. A method of manufacturing a semiconductor device according to claim 78, wherein the light is emitted from one selected from the group consisting of a halogen lamp, a metal halide lamp, a xenon arc lamp, a carbon arc lamp, a high pressure sodium lamp, and a high pressure mercury lamp.

82. A method of manufacturing a semiconductor device according to claim 68, wherein the semiconductor device is an EL display device.

83. A method of manufacturing a semiconductor device according to claim 68, wherein the semiconductor device is at least one selected from the group consisting of a personal computer, a video camera, a mobile computer, a goggle-type display, a player using a recording medium, a digital camera, a projector, a mobile phone, and an electronic book.

84. A method of manufacturing a semiconductor device comprising the steps of:
 forming a first semiconductor film comprising amorphous silicon over a substrate;
 adding a crystallization promoting material on the first semiconductor film;
 crystallizing the first semiconductor film to form a first crystalline semiconductor film containing oxygen at a first concentration;
 forming a second semiconductor film containing oxygen at a second concentration over the first crystalline semiconductor film;
 forming a third semiconductor film containing one conductive type impurity element over the second semiconductor film; and
 reducing a concentration of the crystallization promoting material in the first crystalline semiconductor film by gettering the crystallization promoting material into the third semiconductor film,
 wherein the second concentration is larger than the first concentration.

85. A method of manufacturing a semiconductor device according to claim 84, wherein the third semiconductor film is formed by forming a semiconductor film and by adding one conductive type impurity element to the semiconductor film.

86. A method of manufacturing a semiconductor device according to claim 84, wherein the third semiconductor film containing the one conductive type impurity element is formed by sputtering technique.

87. A method of manufacturing a semiconductor device according to claim 84, further comprising a step, of adding at least one element selected from the group consisting of He, Ne, Ar, Kr, Xe, O, $O_2$, H, and $H_2$ to the third semiconductor film containing the one conductive type impurity element.

88. A method of manufacturing a semiconductor device according to claim 84, wherein the third semiconductor film has an amorphous structure or a crystalline structure.

89. A method of manufacturing a semiconductor device according to claim 84, wherein the crystallization promoting material is at least one element selected from the group consisting of Fe, Ni, Co, Ru, Rh, Pd, Os, Ir, Pt, Cu, and Au.

90. A method of manufacturing a semiconductor device according to claim 84, wherein the crystallizing step is carried out by a heat treatment.

91. A method of manufacturing a semiconductor device according to claim 84, wherein the crystallizing step is carried out by irradiating the first semiconductor film with a light.

92. A method of manufacturing a semiconductor device according to claim 84, wherein the crystallizing step is carried out by a heat treatment and by irradiating the first semiconductor film with a light after the heat treatment.

93. A method of manufacturing a semiconductor device according to claim 84, wherein the reducing step is carried out by a heat treatment.

94. A method of manufacturing a semiconductor device according to claim 84, wherein the reducing step is carried out by irradiating the first crystalline semiconductor film with a light.

95. A method of manufacturing a semiconductor device according to claim 84, wherein the reducing step is carried out by a heat treatment and by irradiating the first crystalline semiconductor film with a light after the heat treatment.

96. A method of manufacturing a semiconductor device according to claim 84, wherein the one conductive type impurity element is one selected from the group consisting of elements belonging to Group 15 or 13 in the periodic table.

97. A method of manufacturing a semiconductor device according to claim 94, wherein the light is emitted from one selected from the group consisting of a halogen lamp, a metal halide lamp, a xenon arc lamp, a carbon arc lamp, a high pressure sodium lamp, and a high pressure mercury lamp.

98. A method of manufacturing a semiconductor device according to claim 84, wherein the semiconductor device is an EL display device.

99. A method of manufacturing a semiconductor device according to claim 84, wherein the semiconductor device is at least one selected from the group consisting of a personal computer, a video camera, a mobile computer, a goggle-type display, a player using a recording medium, a digital camera, a projector, a mobile phone, and an electronic book.

100. A method of manufacturing a semiconductor device according to claim 1, wherein the second concentration of the oxygen in the second semiconductor film is at least $1\times10^{19}/cm^3$ by a secondary ion mass spectroscopy (SIMS).

101. A method of manufacturing a semiconductor device according to claim 18, wherein the second concentration of the oxygen in the second semiconductor film is at least $1\times10^{19}/cm^3$ by a secondary ion mass spectroscopy (SIMS).

102. A method of manufacturing a semiconductor device according to claim 35, wherein the second concentration of the oxygen in the second semiconductor film is at least $1\times10^{19}/cm^3$ by a secondary ion mass spectroscopy (SIMS).

103. A method of manufacturing a semiconductor device according to claim 52, wherein the second concentration of the oxygen in the second semiconductor film is at least $1\times10^{19}/cm^3$ by a secondary ion mass spectroscopy (SIMS).

104. A method of manufacturing a semiconductor device according to claim 68, wherein the second concentration of the oxygen in the second semiconductor film is at least $1\times10^{19}/cm^3$ by a secondary ion mass spectroscopy (SIMS).

105. A method of manufacturing a semiconductor device according to claim 84, wherein the second concentration of the oxygen in the second semiconductor film is at least $1\times10^{19}/cm^3$ by a secondary ion mass spectroscopy (SIMS).

* * * * *